United States Patent
Miura et al.

(10) Patent No.: US 12,518,999 B2
(45) Date of Patent: Jan. 6, 2026

(54) LOAD PORT AND METHOD FOR OPENING/CLOSING STORAGE CONTAINER

(71) Applicant: Sinfonia Technology Co., Ltd., Tokyo (JP)

(72) Inventors: Tatsuya Miura, Tokyo (JP); Shinpei Kogiso, Tokyo (JP); Yuki Ishihara, Tokyo (JP); Tatsuru Ogawa, Tokyo (JP); Atsushi Suzuki, Tokyo (JP); Yuki Matsumoto, Tokyo (JP)

(73) Assignee: Sinfonia Technology Co., Ltd., Tokyo (JP)

( * ) Notice: Subject to any disclaimer, the term of this patent is extended or adjusted under 35 U.S.C. 154(b) by 102 days.

(21) Appl. No.: 18/212,791

(22) Filed: Jun. 22, 2023

(65) Prior Publication Data
US 2023/0415936 A1   Dec. 28, 2023

(30) Foreign Application Priority Data
Jun. 23, 2022   (JP) ................................. 2022-101087

(51) Int. Cl.
*H01L 21/677*   (2006.01)
(52) U.S. Cl.
CPC .. *H01L 21/67772* (2013.01); *H01L 21/67775* (2013.01)
(58) Field of Classification Search
None
See application file for complete search history.

(56) References Cited

U.S. PATENT DOCUMENTS

| | | | | |
|---|---|---|---|---|
| 6,676,356 B2* | 1/2004 | Saeki | ............... | H01L 21/67775 414/217 |
| 6,896,470 B1* | 5/2005 | Chen | ................ | H01L 21/67772 414/217 |
| 7,204,669 B2* | 4/2007 | Cho | ................ | H01L 21/67259 414/800 |
| 7,210,924 B2* | 5/2007 | Mochizuki | ........ | H01L 21/68707 432/259 |
| 7,793,906 B2* | 9/2010 | Natsume | ........... | H01L 21/67775 248/500 |
| 8,414,242 B2* | 4/2013 | Hishiya | ............. | H01L 21/67775 414/217 |
| 11,069,550 B2* | 7/2021 | Fujiwara | ........... | H01L 21/67745 |
| 2002/0044859 A1* | 4/2002 | Lee | ................... | H01L 21/67775 414/411 |

FOREIGN PATENT DOCUMENTS

JP    2016-178133 A    10/2016

* cited by examiner

*Primary Examiner* — Mark C Hageman
(74) *Attorney, Agent, or Firm* — Kilpatrick Townsend & Stockton LLP

(57) ABSTRACT

A load port connected to a transport part includes: a base constituting a portion of a wall of the transport part; a stage on which a storage container is mounted; a stage driving mechanism configured to move the stage in a direction toward or away from the base; a door configured to be capable of opening/closing an opening of the base at a position facing a lid of the storage container mounted on the stage and to be capable of holding the lid disposed to face the opening in a state of closing the opening; a door driving mechanism configured to move the door between an opening position and a closing position; and a movement restricting part configured to restrict a movement of the stage in the direction away from the base by abutting against the stage.

6 Claims, 19 Drawing Sheets

LOAD PORT AND METHOD FOR OPENING/CLOSING STORAGE CONTAINER

CROSS-REFERENCE TO RELATED APPLICATION

This application is based upon and claims the benefit of priority from Japanese Patent Application No. 2022-101087, filed on Jun. 23, 2022, the entire contents of which are incorporated herein by reference.

TECHNICAL FIELD

The present disclosure relates to a load port that is connected to a transport part configured to transport a substrate and that is used to perform carry-in/out of a substrate between the transport part and a storage container that stores substrates, and a method for opening/closing the storage container that stores the substrates.

BACKGROUND

A highly clean environment is required in a semiconductor manufacturing process or the like. In recent years, a mini-environment system has been increasingly used in place of a downflow system to create a clean environment in a semiconductor manufacturing factory and the like. The mini-environment system is a system that creates a localized clean environment only around a substrate, which is an object to be processed, and is capable of creating a highly clean environment at a low cost compared with the downflow system that uses the entire factory as a clean environment.

In the mini-environment system, substrates are stored in a storage container maintained at a higher degree of cleanliness than the external atmosphere for transport, storage, and the like, and a module called an equipment front end module (EFEM) is used to perform substrate transfer between the storage container and a processing apparatus that performs various processes on the storage container and the substrates. The EFEM includes a transport part including a transport chamber and a transport robot installed therein, and a load port connected to the transport part. The load port is an interface for performing carry-in/out of a substrate between a storage container that stores substrates and the transport part, and the substrates stored in the storage container are transferred between the storage container and the transport part (and thus the processing apparatus) without being exposed to the outside atmosphere by passing through the load port (see Patent Document 1).

PRIOR ART DOCUMENTS

Patent Documents

Patent Document 1: Japanese Patent Laid-open Publication No. 2016-178133

SUMMARY

A general load port in the related art will be described with reference to FIG. 18. FIG. 18 is a view schematically illustrating a configuration example of a conventional general load port 900.

The load port 900 includes a plate-like base 901 that constitutes a portion of a wall of the transport part 800 connected thereto. A stage 902 is provided on one side of the base 901, and a storage container 9 storing substrates (e.g., wafers 90) is mounted on the top surface of the stage 902. The stage 902 is provided with a lock claw (not illustrated) and the like, and the storage container 9 is fixed not to be displaced from the stage 902. In addition, a driving mechanism (a stage driving mechanism) 903 configured to move the stage 902 in a direction toward or away from the base 901 is connected to the stage 902. Meanwhile, an opening 901a is formed in the surface of the base 901, and a door 904 is provided to close the opening 901a. A driving mechanism (a door driving mechanism) 905 configured to move the door 904 between a closing position (a position where the door 904 closes the opening 901a) and an opening position (a position where the door 904 opens the opening 901a) is connected to the door 904.

An example of the operation of the load port 900 having the above-described configuration is as follows. First, when a storage container 9, which stores wafers 90, is mounted on the stage 902 by an external transport robot such as an AMHS, a PGV, or the like, the stage 902 is moved in a direction approaching the base 901, so that the storage container 9 mounted on the stage 902 and the base 901 are, for example, brought into contact with each other. In this state, the lid 92 of the storage container 9 is sufficiently close to the door 904 configured to close the opening 901a, and then the door 904 is connected to the lid 92. The door 904 is then moved from the closing position to the opening position together with the lid 92. As a result, the inside of a container main body 91 of the storage container 9 communicates with the inside of the transport part 800 through the opening 901a. Thereafter, wafers 90 (e.g., unprocessed wafers 90) stored in the container main body 91 are taken out by the transport robot of the transport part 800 and loaded into a processing apparatus or the like. In addition, the transport robot stores the wafers 90 (e.g., processed wafers processed by the processing apparatus) in the container main body 91. When a predetermined number of wafers 90 are stored in the container main body 91, the door 904 is moved together with the lid 92 from the opening position to the closing position. At that time, the door 904 is pressed toward the opening 901a (that is, toward the container main body 91 mounted on the stage 902), whereby the lid 92 held by the door 904 is attached to the container main body 91. When the lid 92 is attached to the container main body 91, the connection between the door 904 and the lid 92 is released. Thereafter, the stage 902 is moved in a direction away from the base 901 and the external transport robot carries away the storage container 9 mounted on the stage 902.

In the general storage container 9, since a retainer as a wafer pressing member configured to hold the wafers 90 contained in the container main body 91 so that the wafers 90 are not displaced is provided on the inward surface of the lid 92 as a wafer pressing member, the retainer is elastically deformed to press the wafer 90 when the lid 92 is attached to the container main body 91. Therefore, when attaching the lid 92 to the container main body 91, the lid 92 must be pressed against the container main body 91 with a force greater than at least the reaction force of the retainer. That is, the door 904 holding the lid 92 has to be pressed toward the container main body 91 placed on the stage 902 with a force (door closing force) greater than at least the reaction force of the retainer.

Especially in recent years, there is a tendency to increase the reaction force of the retainer in order to suppress particles from entering the storage container 9. In addition, a front opening shipping box (FOSB), which is a type of a storage container 9 often used for transport between factories, has a greater reaction force compared to a front opening unified pod (FOUP) used as a storage container 9 for substrates (e.g., wafers 90) in a factory. Thus, the demand for opening/closing the FOSB in the load port 900 is increasing. In order to deal with these situations, the door closing force tends to increase.

On the other hand, when attaching the lid 92 to the container main body 91 by pressing the door 904, in order to prevent the stage 902 on which the container main body 91 is fixedly mounted from moving (escaping) when the container main body 91 is pushed, it is necessary to press the stage 902 toward the base 901 by, for example, an air cylinder as a driving source provided in the stage driving mechanism 903. That is, it is necessary to press the stage 902 toward the base 901 with a force that is not less than the door closing force.

However, when the force pressing the stage 902 toward the base 901 (docking force) increases, the door 904 may be pushed back by the storage container 9 mounted on the stage 902 with a large force, and there is a risk that the door 904 will be deformed. For example, in the case of a structure in which the door 904 is supported in a cantilevered state, the door 904 pushed by the storage container 9 may be bent from the supported end side toward the non-supported end side in a direction away from the opening 901a. When such deformation (bending) occurs in the door 904, for example, the lid 92 held by the door 904 may come off without being attached to the container main body 91.

In the recent situation where an increase in door closing force is required, the docking force also inevitably increases, and the possibility of deformation of the door 904 gradually increases.

The present disclosure has been made to solve the above problems and provides a technique capable of avoiding application of an excessive force that causes deformation to a door.

In view of the foregoing, the present disclosure takes the following measures.

That is, according to the present disclosure, a load port connected to a transport part includes: a plate-shaped base that constitutes a portion of a wall of the transport part; a stage on which a storage container is mounted; a stage driving mechanism configured to move the stage in a direction toward or away from the base; a door configured to be capable of opening/closing an opening provided in the base at a position facing a lid of the storage container mounted on the stage and to be capable of holding the lid disposed to face the opening in a state of closing the opening; a door driving mechanism configured to move the door between an opening position in which the door opens the opening and a closing position in which the door closes the opening; and a movement restricting part configured to restrict a movement of the stage in the direction away from the base by abutting against the stage when the door is pressed toward the opening and the lid held by the door is attached to a container main body of the storage container.

With this configuration, for example, when the lid held by the door is attached to the container main body, since a force (a docking force) that presses the stage toward the base is smaller than a force (a door closing force) that presses the door toward the opening, even if the stage is to move in the direction away from the base, the movement restricting part abuts against the stage, thereby restricting the movement of the stage so that the lid can be attached to the container main body mounted on the stage. That is, the lid can be attached to the container main body even if the docking force is not a large force that balances with the door closing force. Therefore, it is possible to reduce the docking force so that applying an excessive force which causes deformation to the door can be avoided.

Preferably, in the load port, the movement restricting part abuts against the stage at a center position of the stage in a direction perpendicular to the moving direction of the stage in a plan view.

With this configuration, the movement of the stage in the direction away from the base can be stably restricted.

Preferably, in the load port, the movement restricting part is switched between a restricting state of restricting the movement of the stage by abutting against the stage and a releasing state of not restricting the movement of the stage.

With this configuration, the restriction of the movement of the stage or the releasing of the restriction can be easily and reliably performed.

In the load port according to the above-described embodiment, the movement restricting part includes: a rotary part provided to be rotatable around a rotary shaft extending along a direction intersecting the moving direction of the stage; and a switching part configured to switch between the restricting state and the releasing state by rotating the rotary part.

With this configuration, the restriction of the movement of the stage and the releasing of the movement can be implemented with a simple configuration.

Preferably, in the load port, when the door is pressed toward the opening and the lid held by the door is attached to the container main body, a force in which the stage driving mechanism presses the stage toward the base is smaller than a force in which the door driving mechanism presses the door toward the opening.

With this configuration, it is possible to sufficiently avoid applying an excessive force, which causes deformation, to the door.

In another aspect of the present disclosure, a method for opening/closing a storage container that stores substrates: a stage moving operation of moving a stage on which the storage container is mounted in a direction toward a base to bring an opening provided in the base at a position facing a lid of the storage container mounted on the stage and the lid closer to each other; a lid holding operation of causing a door closing the opening to hold the lid disposed to face the opening; an opening operation of moving the door together with the lid held by the door from a closing position in which the door closes the opening to an opening position in which the door opens the opening; a closing operation of moving the door together with the lid held by the door from the opening position to the closing position; and a movement restricting operation of causing a movement restricting part to restrict the movement of the stage in a direction away from the base by abutting against the stage when the door is pressed toward the opening and the lid held by the door is attached to a container main body of the storage container in the closing operation.

With this configuration, when the lid held by the door is attached to the container main body, the movement restricting part abuts against the stage, thereby restricting the movement of the stage. Therefore, it is possible to reduce the docking force so that applying an excessive force, which causes deformation to the door, can be avoided.

According to the present disclosure, it is possible to avoid applying an unreasonable force that causes deformation to the door.

BRIEF DESCRIPTION OF DRAWINGS

The accompanying drawings, which are incorporated in and constitute a part of the specification, illustrate embodiments of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

1. Schematic Configuration of EFEM

Figure 1:
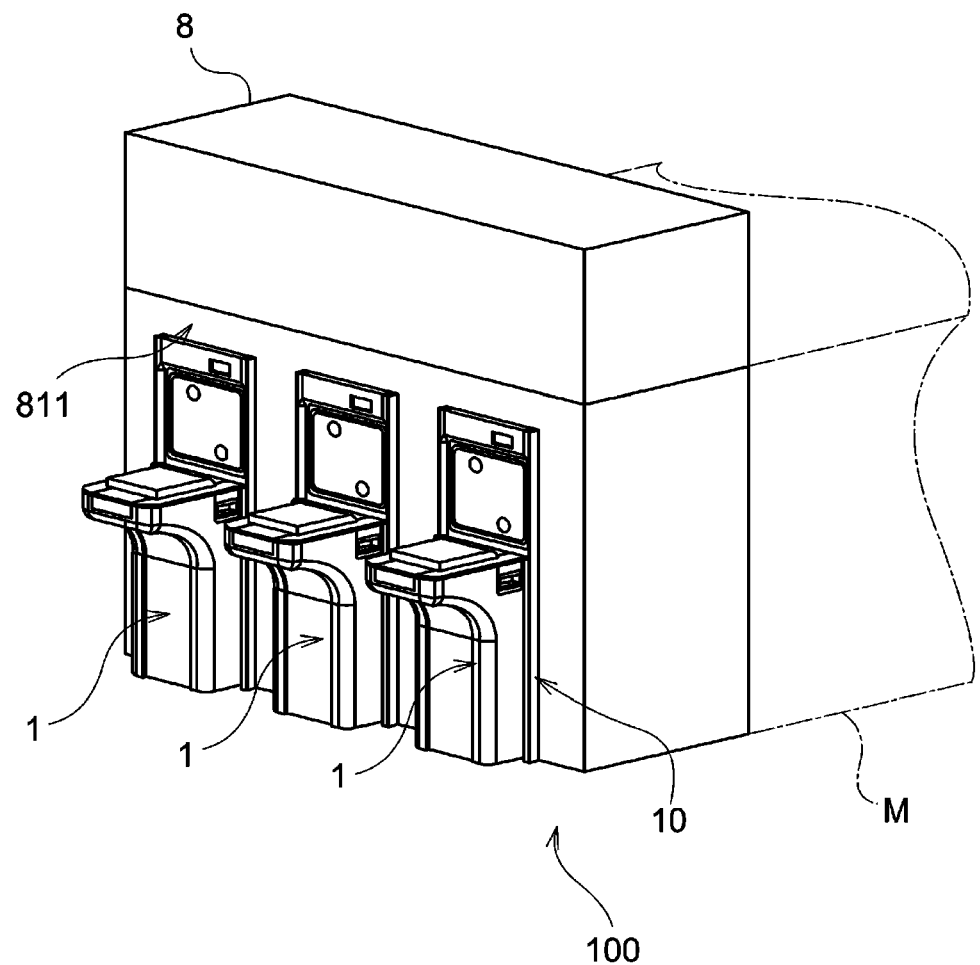
FIG. 1 is a perspective view of an EFEM including a load port according to an embodiment.
Figure 2:
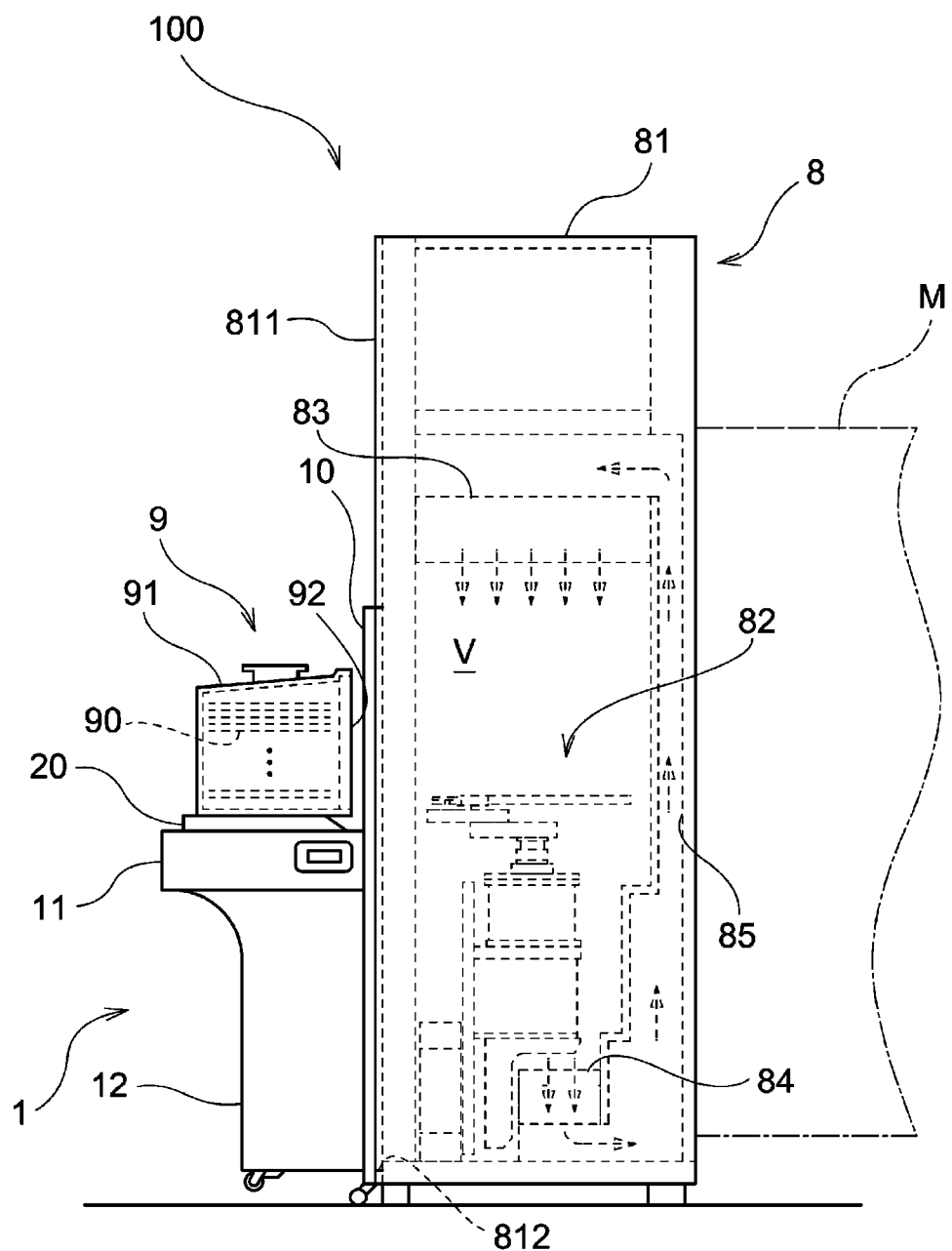
FIG. 2 is a side view illustrating the schematic configuration of the EFEM.

Prior to describing the configuration of a load port according to an embodiment, the schematic configuration of an equipment front end module (EFEM) including the load port will be described with reference to FIGS. 1 and 2. FIG. 1 is a perspective view of an EFEM 100. FIG. 2 is a side view illustrating the schematic configuration of the EFEM 100.

The EFEM 100 is used in a semiconductor manufacturing process or the like. The EFEM 100 is a module that includes a load port 1 and a transport part 8 and has, for example, a configuration in which a plurality of (three in the figure) load ports 1 arranged in a row are connected to one end of the transport part 8. The EFEM 100 is connected to a processing apparatus M or the like that performs various processes on substrates (e.g., wafers 90 in this case) at the end opposite to the end of the transport part 8 on which the load ports 1 are provided, and transfers wafers 90 between the processing apparatus M and a storage container 9. Hereinafter, with respect to the transport part 8, the side on which the load ports 1 are provided is referred to as "front", and the side on which the processing apparatus M is provided is referred to as "rear". In addition, the horizontal direction perpendicular to the front-rear direction (i.e., the direction in which the plurality of load ports 1 are arranged) is referred to as a "left-right direction".

As the storage container 9, for example, a front opening unified pod (FOUP) is used. Specifically, for example, as illustrated in FIG. 2 (and FIG. 6), the storage container 9 includes a container main body 91 with one side opened and a lid 92 that closes the opening of the container main body 91. The container main body 91 is provided with a jaw 911 protruding outward to surround the opening, and the lid 92 is attached to the inside of the jaw 911. In the state in which the lid 92 is attached, the jaw 911 abuts on the periphery of the lid 92 to seal the inside of the container main body 91. Meanwhile, inside the container main body 91, shelves or grooves (not illustrated) are provided in multiple stages for supporting the peripheral edges of the substrates (here, for example, the wafer 90) accommodated therein, so the container main body 91 is configured to be capable of accommodating a plurality of wafers 90 in a horizontal posture in multiple stages. In addition, on the inward surface of the lid 92, retainers 921 are provided as wafer pressing members for holding the wafers 90 accommodated in the container main body 91 such that the wafers 90 are not displaced. Thus, when the lid 92 is pressed against the container main body 91, the retainers 921 are elastically deformed to press the wafers 90. In addition, the lid 92 is provided with a latch (not illustrated) configured to fix the lid to the container main body 91.

The load port 1 is an apparatus configured to allow the inside of the storage container 9, which stores the wafers 90, to communicate with the inside of the transport part 8 without being exposed to the outside atmosphere. Specifically, the load port 1 removes the lid 92 of the storage container 9 from the container main body 91 and allows the inside of the container main body 91 to communicate with the transport space V, which is the internal space of the transport part 8. When the inside of the container main body 91 communicates with the transport space V, the transport robot 82 disposed in the transport space V takes out the wafers 90 (e.g., unprocessed wafers 90) stored in the container main body 91 and carries the wafers 90 into the processing apparatus M. In addition, the transport robot 82 carries out, for example, the wafers that have been subjected to a predetermined process in the processing apparatus M from the processing apparatus M and stores the wafers in the container main body 91. When a predetermined number of wafers 90 are stored in the container main body 91, the load port 1 attaches the lid 92 to the container main body 91 to seal the storage container 9 again. The specific configuration of the load port 1 will be described later.

The transport part 8 is an apparatus for transporting the wafers 90 stored in the storage container 9, and includes a transport chamber 81 and a transport robot 82 disposed therein. One or more openings 812 (three in the illustrated example) are formed in a front wall 811 of the transport chamber 81, and the load ports 1 are airtightly attached to block respective openings 812. In addition, a processing equipment M (e.g., the load-lock chamber of the processing equipment M) is airtightly connected to the rear wall of the transport chamber 81 via, for example, a gate valve. As a result, the internal space (the transport space) V of the transport chamber 81 becomes a substantially sealed space.

The transport space V is maintained at a higher degree of cleanliness than the outside (i.e., the clean room where the processing equipment M is installed). Specifically, for example, a fan filter unit (FFU) 83 is installed in the transport chamber 81, and the gas cleaned by the fan filter unit 83 is sent downward, so that a downflow of clean gas is formed in the transport space V. Preferably, the transport space V is further provided with a chemical filter 84, a circulation duct 85, and the like, and the gas flow reaching the lower portion of the transport space V passes through the chemical filter 84. After contaminants and the like are removed from the gas flow by the chemical filter 84, the gas flow is returned to the fan filter unit 83 through the circulation duct 85 and is sent downward again (that is, circulation of gas flow is formed).

In addition, the transport chamber 81 is provided with a gas supply port and a gas discharge port (both not illustrated) and is configured such that a predetermined gas (e.g., nitrogen gas, dry air, dry nitrogen gas, or the like) can be purged through the gas supply port and the gas in the transport space V can be discharged through the gas discharge port. By controlling the amount of gas supplied through the gas supply port and the amount of gas discharged through the gas discharge port, the pressure, gas concentration, and the like in the transport space V can be adjusted to arbitrary values. Here, by appropriately controlling the supply amount of gas, the discharge amount of gas, and the like of the gas, the transport space V is maintained at a slightly higher pressure (slight positive pressure) with respect to the outside (i.e., the clean room in which the processing apparatus M is installed). As a result, even if there is a slight gap that allows communication between the inside and outside of the transport chamber 81, it is ensured that no gas will flow into the transport space V from the outside through the gap.

2. Configuration of Load Port

Figure 3:
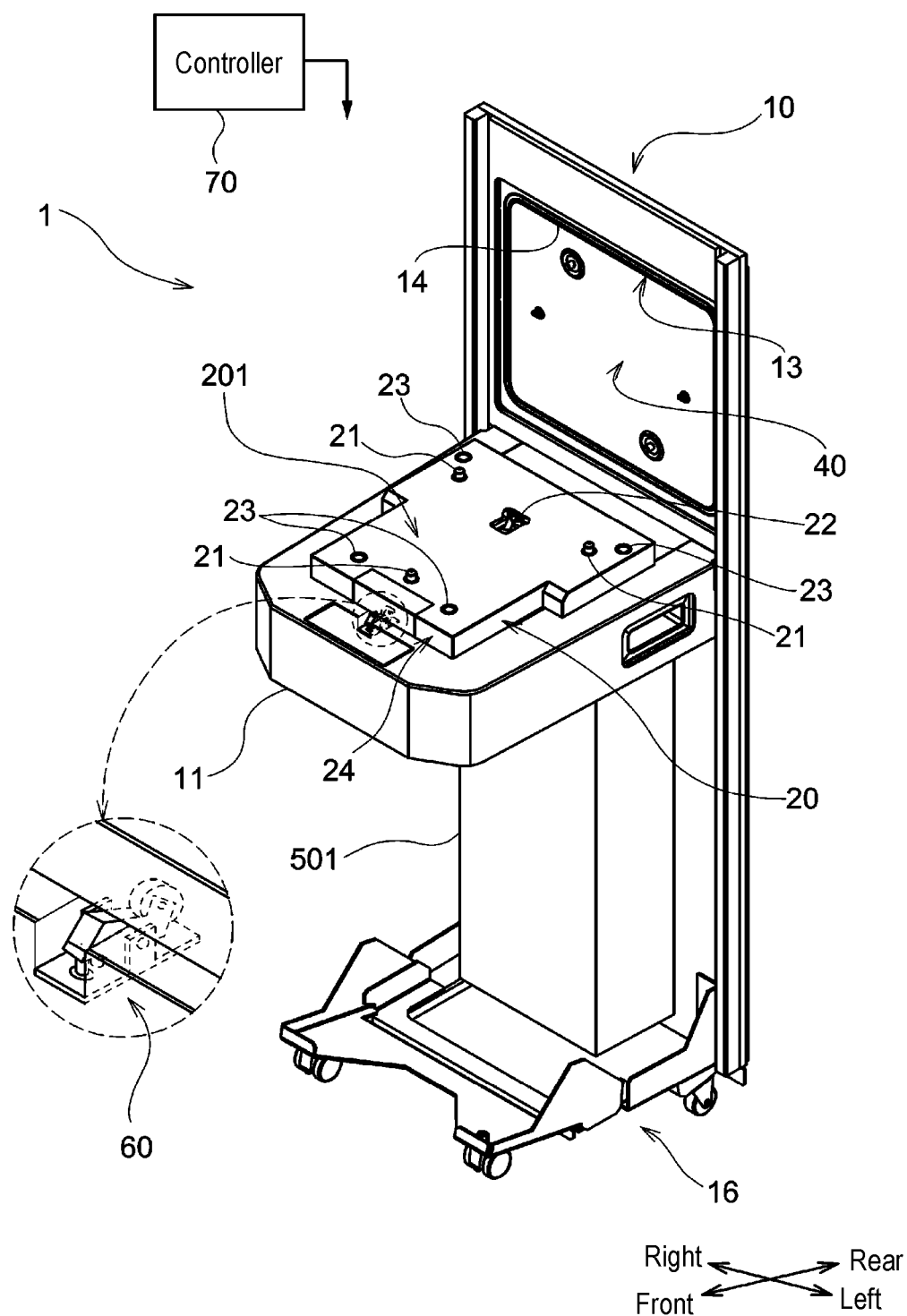
FIG. 3 is a view illustrating the load port viewed from obliquely above the front of the same.
Figure 4:
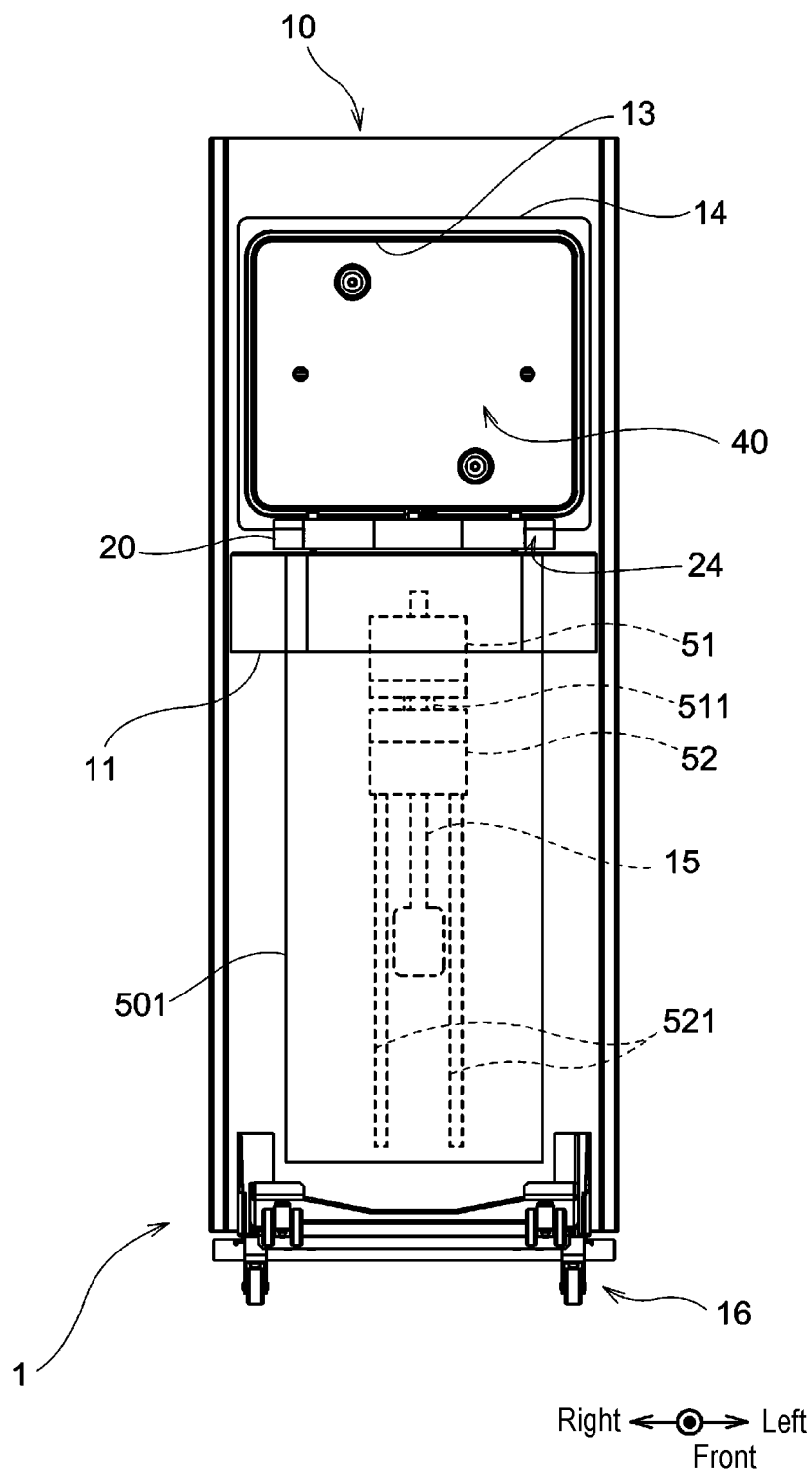
FIG. 4 is a view of the load port viewed from the front.
Figure 5:
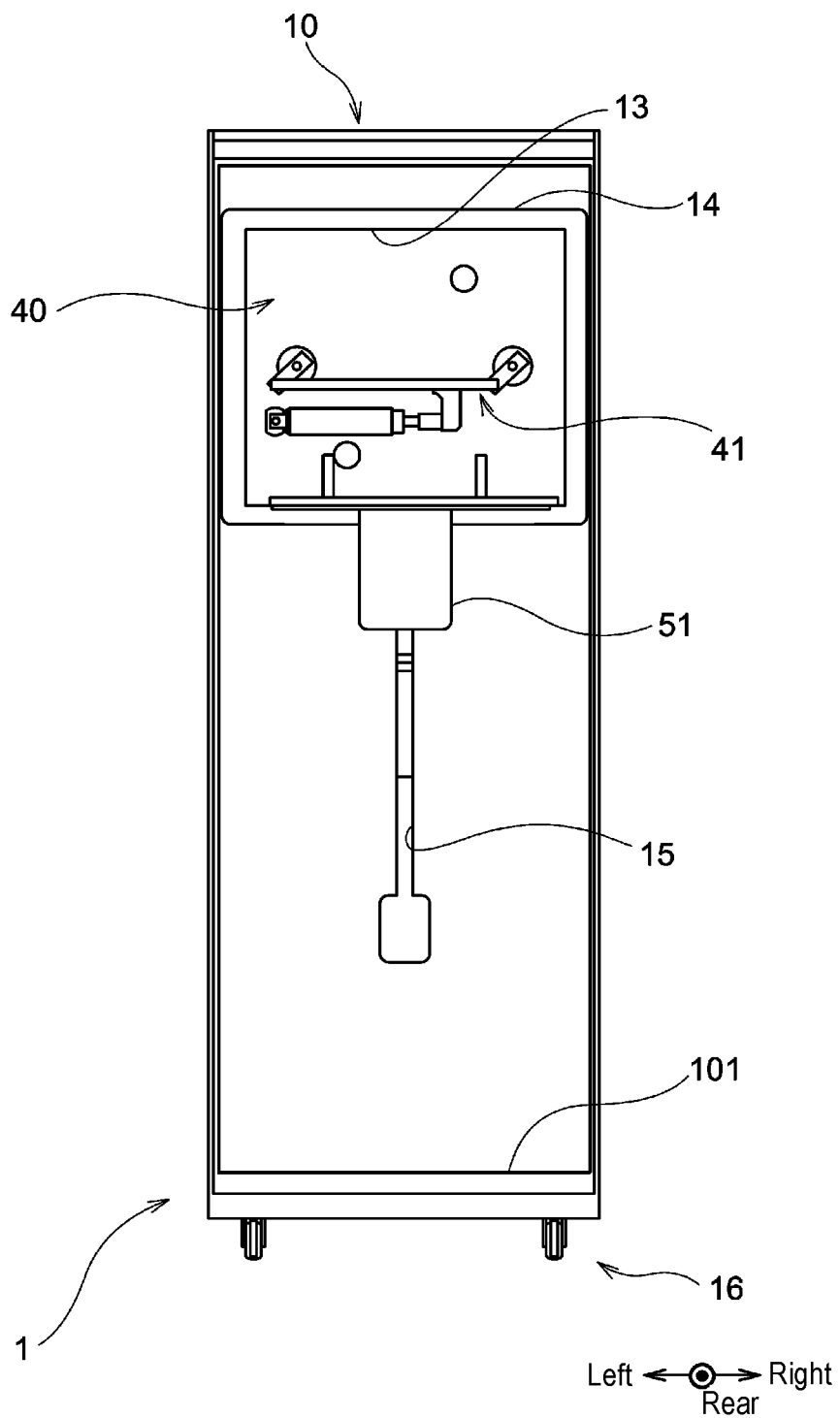
FIG. 5 is a view of the load port viewed from the rear.
Figure 6:
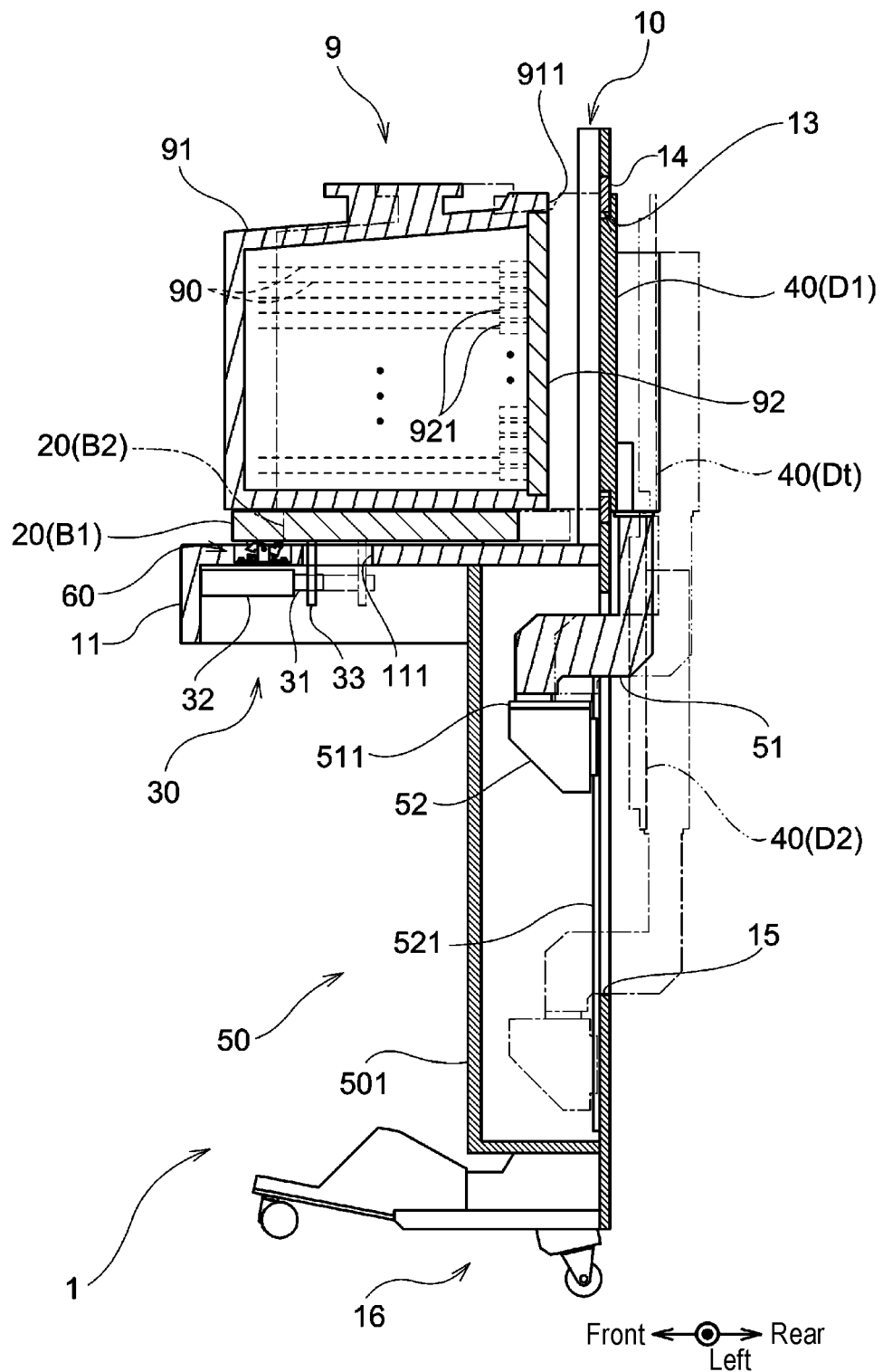
FIG. 6 is a view of the load port viewed from a side.

The configuration of the load port 1 will be specifically described with reference to FIGS. 3 to 6 in addition to FIGS. 1 and 2. FIG. 3 is a view illustrating the load port 1 viewed from obliquely above the front of the same. FIG. 4 is a front view of the load port 1. FIG. 5 is a rear view of the load port 1. FIG. 6 is a side view of the load port 1.

The load port 1 includes a base 10, a stage 20, a stage driving mechanism 30, a door 40, a door driving mechanism 50, and a movement restricting part 60. The load port 1 also includes a controller 70 configured to control each of these parts 10 to 60.

(Base 10)

The base 10 is a plate-like member constituting a portion of a front wall of the transport part 8 (FIG. 1). Specifically, the base 10 is a plate-like member (panel member) that is slightly larger than the opening 812 (FIG. 2) formed in the front wall 811 of the transport chamber 81. The base 10 is in an upright posture and is attached to the front wall 811 to close the opening 812 to constitute the front wall of the transport part 8 together with the front wall 811. For example, a gasket 101 is disposed on the rear surface of the base 10, and the base 10 is airtightly attached to the front wall 811 via the gasket 101.

A base pedestal 11 that protrudes forward in a substantially horizontal posture is provided on the front surface of the base 10. A cover 12 (FIG. 2) is provided below the base pedestal 11 (for convenience of description, FIGS. 3 to 6 illustrate a state in which the cover 12 is removed). An opening 13 configured to pass a wafer 90 therethrough is provided in the surface of the base and a window unit 14 having a window frame shape is attached to surround the opening 13. In other words, the peripheral edge of the opening 13 is defined by the frame of the window unit 14. The opening 13 is formed at a position facing the lid 92 of the storage container 9 mounted on the stage 20 provided on the base pedestal 11. The size of the opening 13 (i.e., the size within the frame of the window unit 14) is slightly larger than the lid 92 of the storage container 9 so that the lid 92 can pass through the opening 13. In addition, a slit 15 into which a support frame 51 (to be described later) is to be inserted is provided to extend vertically in the surface of the base 10 at a position below the opening 13. Furthermore, a leg part 16 including casters and the like is provided on the front surface of the base 10 to protrude forward, and the leg part 16 abuts on a floor surface to support the base 10.

(Stage 20)

The stage 20 is a flat plate-shaped member and is arranged horizontally on the base pedestal 11 that protrudes forward from the base 10. A storage container 9 is mounted on the stage 20. That is, the top surface of the stage 20 forms a mounting surface 201 on which the storage container 9 is mounted. The storage container 9 is mounted on the mounting surface 201 in such a direction that the lid 92 faces the base 10.

The mounting surface 201 is provided with positioning pins (guide pins) 21 that are engaged with recesses provided in the bottom surface of the storage container 9 to guide and position the storage container 9 to a predetermined position. In addition, the mounting surface 201 is provided with a locking part 22 that locks the storage container 9 at the predetermined position by being engaged with a fixed portion (e.g., a front retaining feature) provided on the bottom surface of the storage container 9.

In addition, one or more gas nozzles 23 are provided on the mounting surface 201. Each gas nozzle 23 may be used as a gas supply nozzle to supply a predetermined gas (e.g., nitrogen gas, inert gas, dry air, or the like) into the storage container 9 via a gas supply valve provided on the bottom surface of the storage container 9. Alternatively, each gas nozzle may be used as a gas discharge nozzle for discharging the gas inside the storage container 9 via a gas discharge valve or the like provided on the bottom surface of the storage container 9. For example, when the gas nozzles 23 are provided at the four corners of the mounting surface 201, a pair of gas nozzles 23 on the front side may be used as gas supply nozzles, and a pair of gas nozzles 23 on the rear side may be used as gas discharge nozzles. Each gas nozzle 23 is disposed below the mounting surface 201 when not in use, and is moved upward to be connected to a gas supply valve or gas discharge valve of the storage container 9 when in use. By purging a predetermined gas (e.g., nitrogen gas, dry air, dry nitrogen gas, or the like) into the storage container 9 from the gas nozzles 23 as gas supply nozzles through the gas supply valves and by discharging gas within the storage container 9 from the gas nozzles 23 as gas discharge nozzles through the gas discharge valves, the gas inside the storage container 9 can be replaced with a predetermined gas. In addition, by controlling the supply amount of gas and the discharge amount of gas, the pressure inside the storage container 9 or the like can be adjusted to an arbitrary value. Preferably, by appropriately controlling the supply amount of gas and the discharge amount of gas, the pressure inside the storage container 9 is made slightly higher than that of the outside (e.g., the clean room where the processing apparatus M is installed and the transport space V of the transport part 8). This makes it difficult for gas to flow into the container main body 91 when the lid 92 of the storage container 9 is opened.

(Stage Driving Mechanism 30)

The stage driving mechanism 30 moves the stage 20 in a direction toward and away from the base 10 (the front-rear direction) while maintaining the horizontal posture, thereby moving the stage 20 to a separation position B1 (the position indicated by the solid line in FIG. 6) and a docking position B2 (the position indicated by the dashed line in FIG. 6). Here, the "separation position B1" is a position where the stage 20 is separated from the base 10 by a predetermined distance, and a position for an external robot, such as an AMHS or a PGV, to transfer the storage container 9 to and from the stage 20. On the other hand, the "docking position B2" is a position closer to the base 10 than the separation position B1. Specifically, the docking position B2 is, for example, a position where the jaw 911 of the storage container 9 mounted on the stage 20 abuts on the base 10 (specifically, the window unit 14).

Specifically, the stage driving mechanism 30 includes, for example, a rod (cylinder rod) 31 provided in a posture that extends forward and rearward in a horizontal plane, a cylinder (air cylinder) as a driving mechanism that moves the rod 31 forward and rearward along its extending direction, and a connector 33 interconnecting the rod 31 and the stage 20. The air cylinder 32 controls the air pressure by, for example, the opening/closing of a solenoid valve to move the rod 31 forward and rearward with the air pressure. The rod 31 and the air cylinder 32 are arranged inside the base pedestal 11. On the other hand, the connector 33 is provided by passing through a slit 111 provided on the top surface of the base pedestal 11 and extending in the front-rear direction. The connector 33 is connected to the rod 31 at the lower end of the connector 33 protruding downward from the base pedestal 11 and is connected to the bottom surface of the stage 20 at the upper end of the connector 33 protruding upward from the base pedestal 11. In such a configuration, when the rod 31 moves forward and rearward by being driven by the air cylinder 32, the stage 20 connected to the rod 31 via the connector 33 is guided by a linear guide (not illustrated) provided on the base pedestal 11 to move forward and rearward in a horizontal plane.

(Door 40)

The door 40 is a member configured to open/close the opening 13 formed in the base 10, and is provided on the rear surface side of the base 10 (that is, on the side opposite to the stage 20 with the base 10 interposed therebetween). The door 40 is made of a plate-like member that is slightly larger than the opening 13, and closes the entire opening 13 by being disposed at a closing position D1 (the position indicated by the solid line in FIG. 6), which will be described later. At this time, the outer peripheral portion of the front surface of the door 40 abuts on the rear surface of the base 10 (specifically, the window unit 14) (or is in close contact with the rear surface of the base 10 via a seal member or the like), thereby sealing the transport space V. On the other hand, when the door 40 is disposed at an opening position D2 (the position indicated by the dashed line in FIG. 6), which will be described later, the entire opening 13 is opened.

A lid holding mechanism 41 is provided in the door 40. The lid holding mechanism 41 connects and integrates the door 40 with the lid 92 disposed to face the opening 13 in a state in which the door 40 closes the opening 13, thereby causing the lid 92 to be held by the door 40. In addition, the lid holding mechanism 41 performs latching between the container main body 91 and the lid 92 and release of the latching.

(Door Driving Mechanism 50)

The door driving mechanism 50 moves the door 40 between the closing position D1 and the opening position D2. Here, the "closing position D1" is a position where the door 40 completely closes the opening 13. On the other hand, the "opening position D2" is a position where the door 40 opens the opening 13 as a whole. Specifically, the opening position is a position where the door 40 retreats below the opening 13 and does not completely overlap the opening 13.

Specifically, the door driving mechanism 50 includes, for example, a support frame 51 that supports the door 40 and a lifting block 52 that supports the support frame 51. The support frame 51 is connected at one end of the support frame 51 to the door 40 (e.g., the lower portion of the rear surface of the door 40), extends downward from the one end, is bent forward in the middle, passes through the slit 15 provided in the base 10 while extending substantially horizontally, and is connected at the other end of the support frame 51 to the lifting block 52 in front of the base 10. Between the support frame 51 and the lifting block 52, a slide support 511, which supports the support frame 51 to be movable forward and rearward is provided, so that the support frame 51 is supported to be movable forward and rearward with respect to the lifting block 52. In addition, between the lifting block 52 and the base 10, a slide rail 521, which supports the lifting block 52 to be movable, is provided, so that the lifting block 52 is supported to be vertically movable with respect to the base 10.

The door driving mechanism 50 further includes a driving source (e.g., a stepping motor as a driving source), a linear motion mechanism configured to convert the power given from the driving source into the lifting motion of the lifting block 52, a linear motion mechanism configured to convert the power into a back-and-forth motion of the support frame 51, a link mechanism configured to link these two linear motion mechanisms, and the like (all of which are not illustrated). Each linear motion mechanism may be configured to include, for example, a feed screw or the like. For example, when moving the door 40 from the closing position D1 to the opening position D2, the power from the driving source is transmitted to the linear motion mechanism on the support frame 51 side and then transmitted to the linear motion mechanism on the lifting block 52 side via the link mechanism. As a result, the door 40 at the closing position D1 is moved rearward and first disposed at a motion conversion position Dt (the position indicated by the two-dot chain line in FIG. 6) and is then moved downward and disposed at the opening position D2. On the other hand, when moving the door 40 from the opening position D2 to the closing position D1, the power from the driving source is transmitted to the linear motion mechanism on the lifting block 52 side and then transmitted to the linear motion mechanism on the support frame 51 side via the link mechanism. As a result, the door 40 at the opening position D2 is moved upward and first disposed at the motion conversion position Dt and is then moved forward and disposed at the closing position D1.

A housing 501 is airtightly connected to the base 10 on the front surface of the base 10. Among the elements provided in the door driving mechanism 50, the elements arranged on the front surface side of the base 10 are housed in this housing 501. This prevents the gas, which flows into the housing 501 through the slit 15, from flowing out of the housing 501. Further, among the elements provided in the door driving mechanism 50, the slide support 511 and the slide rail 521, which have sliding portions, are provided on the front surface side of the base 10 (that is, outside the transport space V) and housed in the housing 501 and a communicating portion between the housing 501 and the transport space V is formed by the thin slit 15, whereby particles generated at the sliding portions are prevented from entering the transport space V.

(Movement Restricting Part 60)

When attaching the lid 92 of the storage container 9 to the container main body 91, specifically, when pressing the door 40 toward the opening 13 to attach the lid 92 held by the door 40 to the container main body 91, the movement restricting part 60 abuts against the stage 20 and restricts the movement of the stage 20 in the direction away from the base 10 (forward). In this embodiment, one movement restricting part 60 is provided at a substantially central position in the left-right direction of the base pedestal 11 (FIG. 3), and the movement restricting part 60 abuts against the stage 20 at the central position of the stage 20 in the direction (the left-right direction) orthogonal to the movement direction of the stage 20 (the front-rear direction) in a plan view to restrict its movement. The specific configuration of the movement restricting part 60 will be described later.

(Controller 70)

The controller 70 is an element configured to control the operations of respective parts 10 to 60 provided in the load port 1 and to perform various kinds of arithmetic processing, and is configured with a general computer having an electric circuit, a microcomputer, or the like. Specifically, the controller 70 includes, for example, a processor such as a central processor unit (CPU) as a central processor responsible for data processing, a non-volatile storage configured with a read only memory (ROM) that stores basic programs or the like, a random access memory (RAM) that is used as a work area when the CPU performs predetermined processing (data processing), a flash memory, and a hard disk drive, a bus line that interconnects these components, and the like. For example, when the CPU executes a program stored in a storage device, the controller 70 executes processing defined by the program. However, some or all of the processing executed by the controller 70 may be executed by hardware such as a dedicated logic circuit (e.g., a dedicated processor).

The load port 1 is provided with various sensors (e.g., a sensor configured to detect that the storage container 9 is mounted on the stage 20, a sensor configured detect that the stage 20 is disposed at the docking position B2, a sensor configured to detect that the door 40 is disposed at the closing position D1, and the like) at appropriate positions. The controller 70 is electrically connected to each sensor provided in the load port 1. The controller 70 controls each of the parts 10 to 60 (e.g., the locking part 22 and the gas nozzles 23 provided in the stage 20, the stage driving mechanism 30, the lid holding mechanism 41 provided in the door 40, the door driving mechanism 50, a solenoid 633*b* (described later) provided in the movement restricting part 60, and the like) based on the detected information acquired from each sensor.

3. Operation Overview of Movement Restricting Part

An operation overview of the movement restricting part 60 will be described with reference to FIGS. 7A to 7D.

FIGS. 7A to 7D are views for explaining the operation overview of the movement restricting part 60.

The movement restricting part 60 is configured to switch between a restricting state K1 in which the movement of the stage 20 in a direction away from the base 10 (forward) by abutting against the stage 20 is restricted, and a releasing state K2 in which the movement of the stage 20 is not restricted.

Figure 7A:
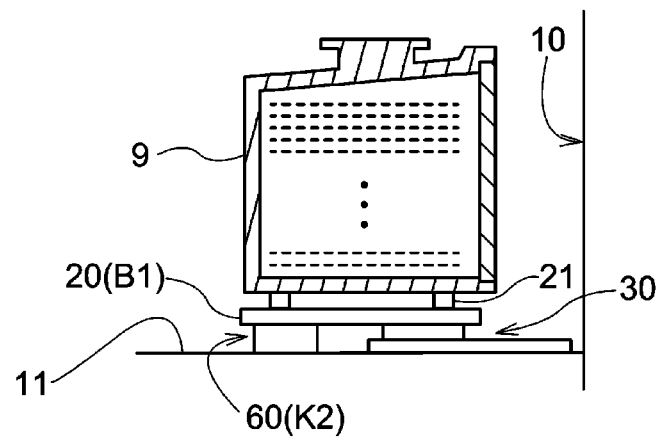
FIGS. 7A to 7D are views for explaining an operation overview of a movement restricting part.

For example, when the stage 20 on which a storage container 9 is mounted is moved from the separation position B1 (undocking position) to the docking position B2, the movement restricting part 60 is in the releasing state K2 and does not restrict the movement of the stage 20 (FIG. 7A).

Figure 7B:
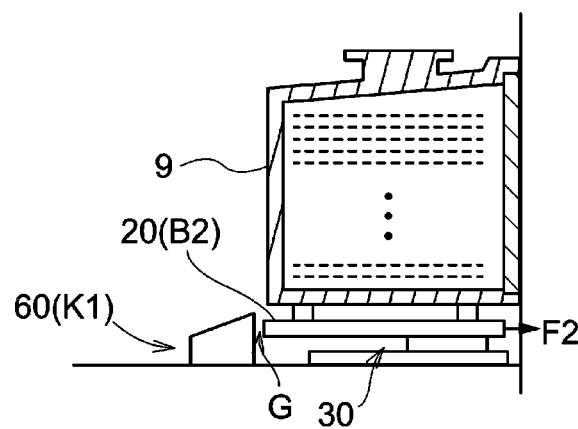

On the other hand, in the state in which the stage 20 is disposed at the docking position B2, the movement restricting part 60 is switched from the releasing state K2 to the restricting state K1 (FIG. 7B). As will be described later, in a state in which the stage 20 is disposed at the docking position B2, the door 40 holds the lid 92 of the storage container 9, and the door 40 holding the lid 92 moves from the closing position D1 to the opening position D2, thereby opening the storage container 9.

Figure 7C:
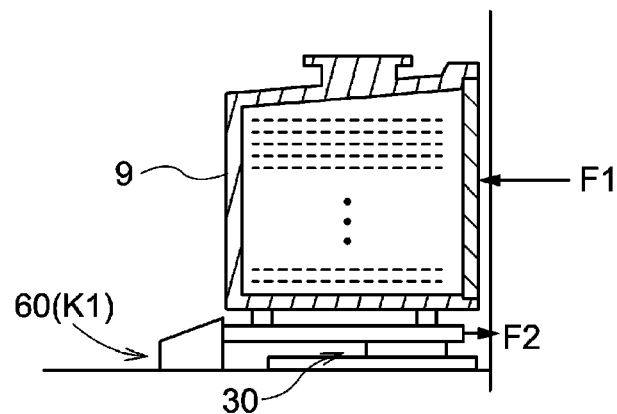
Figure 7D:
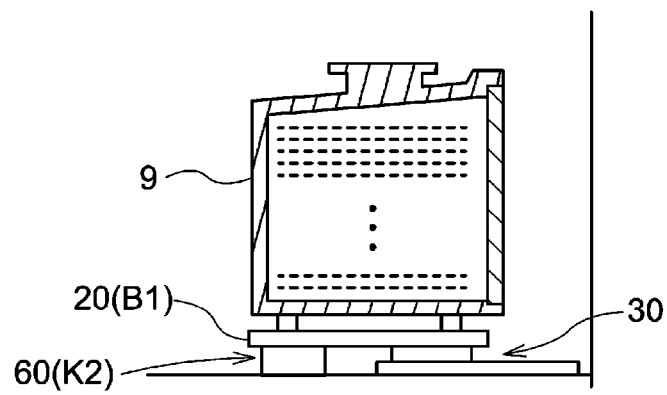

Thereafter, as will be described later, the door 40 holding the lid 92 is moved from the opening position D2 to the closing position D1, and the lid 92 is attached to the container main body 91, thereby closing the storage container 9. When attaching the lid 92 to the container main body 91, the door 40 holding the lid 92 is pressed toward the opening 13 (that is, toward the container main body 91 mounted on the stage 20) with a predetermined door closing force F1. At this time, the movement restricting part 60 in the restricting state K1 abuts against the stage 20 and restricts the movement of the stage 20 in the direction away from the base 10 (FIG. 7C). That is, the movement restricting part 60 functions as an anti-back mechanism that receives a load of the stage 20 (a load corresponding to the difference between the door closing force F1 and a docking force F2 that presses the stage 20 toward the base 10) to prevent the stage 20 from retreating when the stage is pushed by the door closing force F1 via the storage container 9.

Thereafter, the movement restricting part 60 is switched from the restricting state K1 to the releasing state K2, and then the stage 20 is moved from the docking position B2 to the separation position B1.

4. Configuration of Movement Restricting Part

Figure 8:
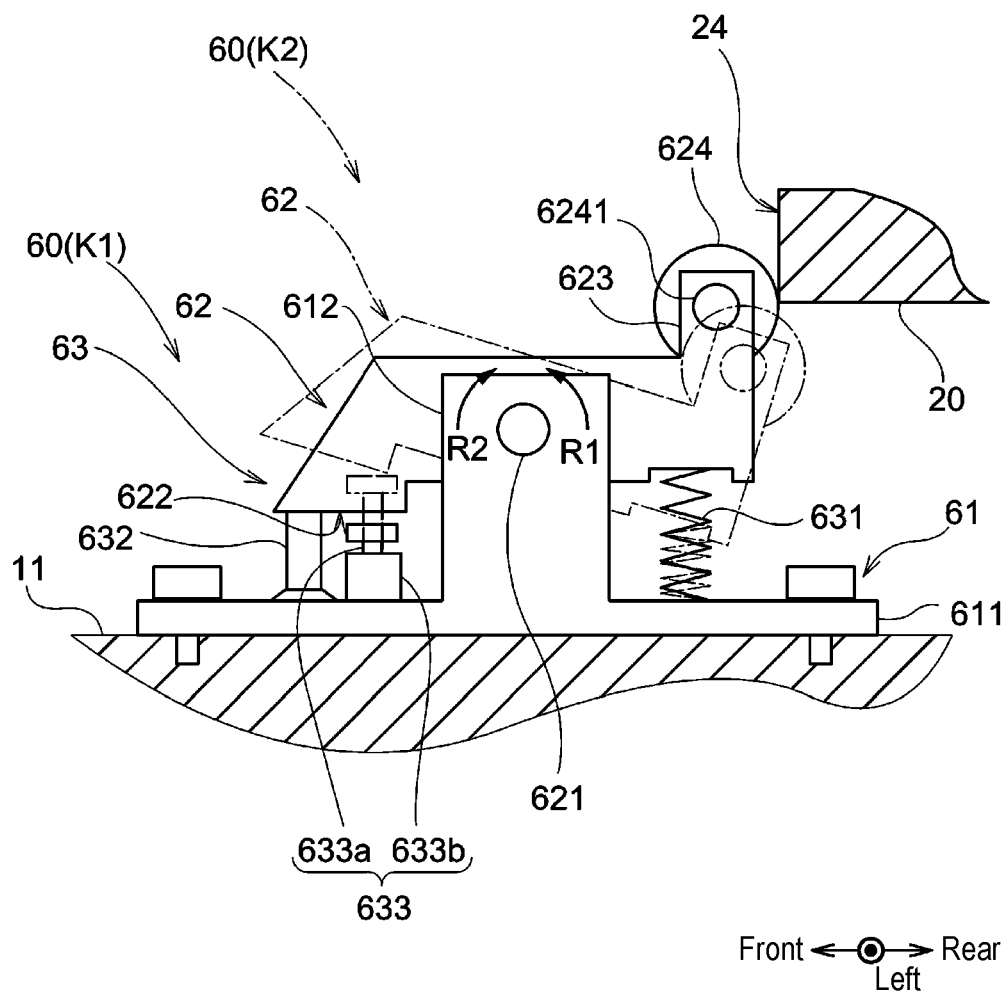
FIG. 8 is a side view illustrating the configuration of the movement restricting part.

The specific configuration of the movement restricting part 60 will be described with reference to FIG. 8. FIG. 8 is a side view illustrating the configuration of the movement restricting part 60.

The movement restricting part 60 includes a base part 61, a rotary part 62, and a switching part 63.

The base part 61 is a member that rotatably supports the rotary part 62, and includes a flat plate-like bottom plate 611 fixed to a predetermined position of the base pedestal 11 (e.g., in a recess provided in the base pedestal 11) by using screws or the like and support pieces 612 standing upright from each of the left and right end edges of the bottom plate 611. A rotary shaft 621 of the rotary part 62 is rotatably bridged between a pair of support pieces 612, whereby the rotary part 62 is rotatably supported with respect to the base part 61.

The rotary part 62 is an elongated member extending in the front-rear direction and is provided with the rotary shaft 621, which penetrates the rotary part 62 in the left-right direction, at substantially the center of the rotary part 62 in the front-rear direction. As described above, since the rotary shaft 621 is rotatably bridged between the pair of support pieces 612 of the base part 61, the rotary part 62 is supported to be rotatable with respect to the base part 61 to be rotatable around the rotary shaft 621. However, in the rotary part 62, the rotary shaft 621 is disposed in such a posture that the rotary shaft 621 extends along the left-right direction (that is, the left-right direction that intersects (here, orthogonally) the front-rear direction that is the movement direction of the stage 20).

An abutment portion 622 that protrudes toward the base part 61 is provided in a portion of the rotary part 62 on the front side of the rotary shaft 621. A pair of roller support pieces 623 facing each other in the left-right direction is provided in a portion of the rotary part 62 on the rear side of the rotary shaft 621 to protrude from the opposite side to the base part 61. A roller 624 is rotatably supported between the pair of roller support pieces 623. That is, the roller 624 is rotatably supported with respect to the rotary part 62 since a rotary shaft 6241 of the roller 624 is rotatably bridged between the pair of roller support pieces 623. However, the roller 624 is disposed in such a posture that the rotary shaft 6241 extends along the left-right direction (that is, in parallel to the extending direction of the rotary shaft 621 of the rotary part 62).

By rotating the rotary part 62 around the rotary shaft 621, the switching part 63 switches between the restricting state K1 (the posture indicated by the solid line in FIG. 8) and the releasing state K2 (the posture indicated by the one-dot chain line in FIG. 8). Specifically, the switching part 63 includes, for example, an elastic member 631, a stopper 632, and a pressing part 633.

The elastic member 631 is provided between the rotary part 62 and the base part 61 at a position on the rear side of the rotary shaft 621. The elastic member 631 is configured with, for example, a spring, and an upper end and a lower end of the elastic member 631 are connected to the rotary part 62 and the base part 61 (specifically, the bottom plate 611) in a contracted state, respectively. Therefore, the elastic member 631 presses the rotary part 62 at position on the rear side the rotary shaft 621 in the direction away from the base part 61. Now, assuming that the rotating direction around the rotary shaft 621 in which the position on the rear side of the rotary shaft is separated from the base part 61 is a "first rotating direction R1", the elastic member 631 moves the rotary part 62 in the first rotating direction R1.

The stopper 632 is a rod-shaped member erected on the base part 61 (specifically, the bottom plate 611) and is provided at a position facing the abutment portion 622 of the rotary part 62. The stopper 632 restricts the rotation of the rotary part 62 in the first rotating direction R1.

The pressing part 633 is provided between the rotary part 62 and the base part 61 at a position on the front side of the rotary shaft 621. Specifically, the pressing part 633 includes, for example, a rod (a cylinder rod) 633a provided in such a posture as to extend in a normal direction of the base part 61 (specifically, the bottom plate 611), and a solenoid (a direct-acting solenoid) 633b as a driver that moves the rod 633a forward and rearward along the existing direction of the same. The solenoid 633b is electrically connected to the controller 70 and drives the rod 633a in response to an instruction from the controller 70. When the rod 633a is moved up (moved in the direction away from the base part 61) by being driven by the solenoid 633b, the tip of the rod 633a abuts on the abutment portion 622 and pushes up the abutment portion 622. That is, the pressing part 633 presses the rotary part 62 at a position on the front side of the rotary shaft 621 in a direction away from the base part 61. As a result, the rotary part 62 rotates in a rotating direction (hereinafter, referred to as "second rotating direction R2") opposite to the first rotating direction R1.

For example, when the rotary part 62 is rotated in the first rotating direction R1 by being pressed by the elastic member 631 in the state in which the stopper 632 and the abutment portion 622 are spaced apart from each other (the state indicated by the one-dot chain line in FIG. 8), the rotation progresses and the stopper 632 abuts on the abutment portion 622, thereby stopping the rotation of the rotary part 62 (the state indicated by the solid line in FIG. 8). The roller 624 is disposed at a height overlapping at least a portion of the stage 20 when the rotary part 62 is in a rotating posture to abut on the stopper 632 in the abutment portion 622. In other words, the upper end of the roller 624 is disposed above the lower end of a front end surface 24 of the stage 20. When the rotary part 62 is in such a rotating posture, even if the stage 20 is to move forward, the stage 20 cannot move further if the roller 624 of the rotary part 62 abuts against the front end surface 24 thereof. That is, when the rotary part 62 is in such a rotating posture, the movement restricting part 60 abuts against the front end surface 24 of the stage 20 and enters the restricting state K1 in which the movement of the stage 20 is restricted.

On the other hand, in the state where the movement restricting part 60 is in the restricting state K1 (the state indicated by the solid line in FIG. 8), the abutment portion 622 of the rotary part 62 is pushed up by the rod 633a and the rotary part 62 rotates in the second rotating direction R2. As the rotation proceeds, the roller 624 moves downward, and when the rotating angle exceeds a certain angle, the roller 624 is disposed at a height that does not overlap the stage 20 (the state indicated by the one-dot chain line in FIG. 8). In other words, the upper end of the roller 624 is disposed at the height that is the same as or lower than the lower end of the front end surface 24 of the stage 20. When the rotary part 62 is in such a rotating posture, the stage 20 is movable forward and rearward without being hindered by the rotary part 62. That is, when the rotary part 62 is in such a rotating posture, the movement restricting part 60 is in the releasing state K2 in which the movement of the stage 20 is not restricted.

As described above, the movement restricting part 60 is switched from the releasing state K2 to the restricting state K1 when the rotary part 62 is rotated in the first rotating direction R1 by being pressed by the elastic member 631, and is switched from the restricting state K1 to the releasing state K2 when the rotary part 62 is rotated in the second rotating direction R2 by being pressed by the pressing part 633.

5. Operation of Load Port

Figure 9:
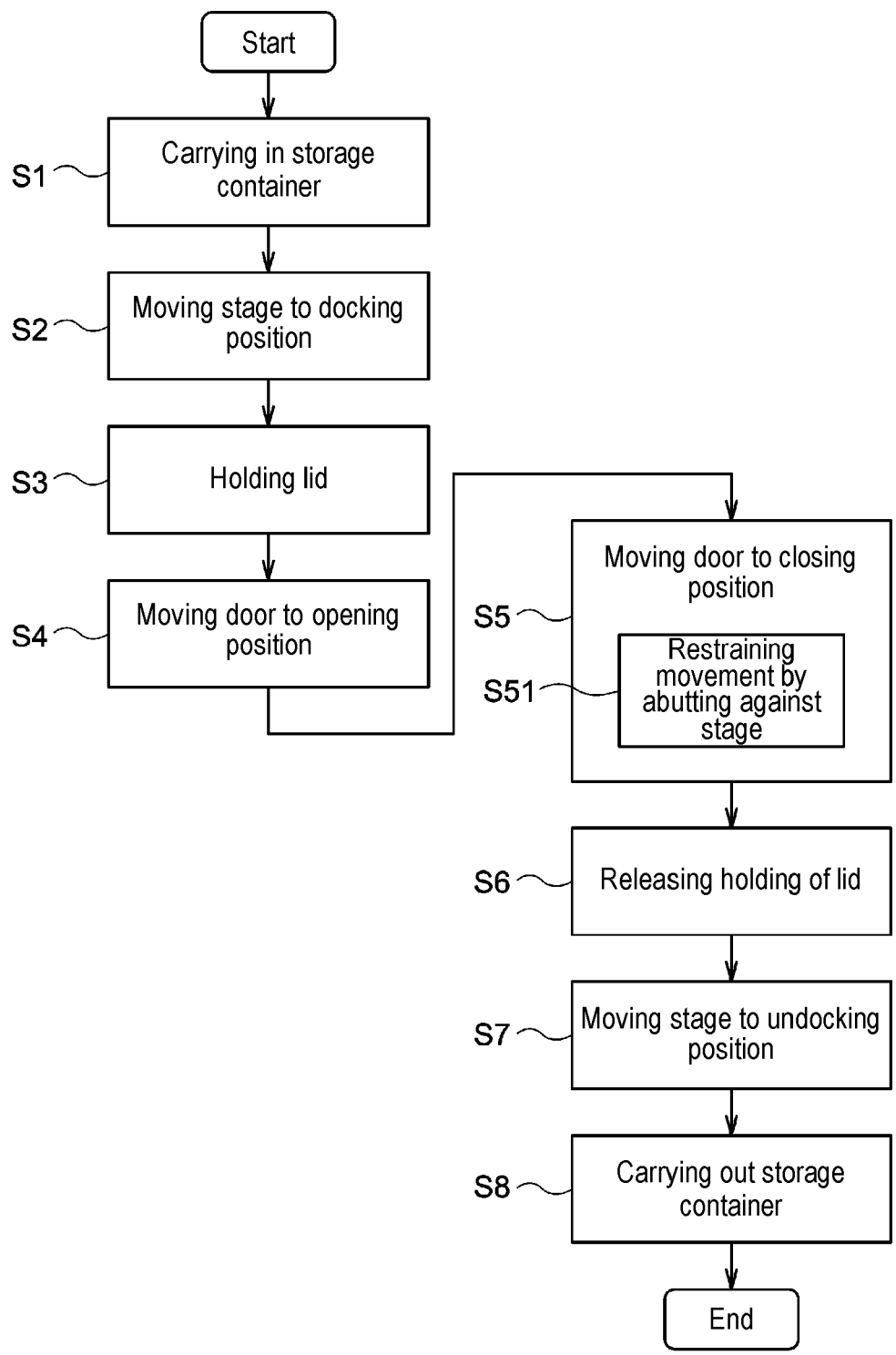
FIG. 9 is a view illustrating the flow of operation of the load port.

The operation of the load port 1 will be specifically described with reference to FIG. 9 and FIGS. 10A to 14B. FIG. 9 is a view showing the operation flow of the load port 1. In each of FIGS. 10A to 14B, a side view of the load port 1 in each operating state and an enlarged side view of the movement restricting part 60 in the load port 1 are illustrated. A series of processes described below is performed by controlling, by the controller 70, each of the parts 10 to 60 provided in the load port 1 (specifically, the locking part 22 and the gas nozzles 23 provided in the stage 20, the stage driving mechanism 30, the lid holding mechanism 41 provided in the door 40, the door driving mechanism 50, the solenoid 633*b* provided in the movement restricting part 60, and the like).

Step S1: Storage Container Carry-In Operation

Figure 10A:
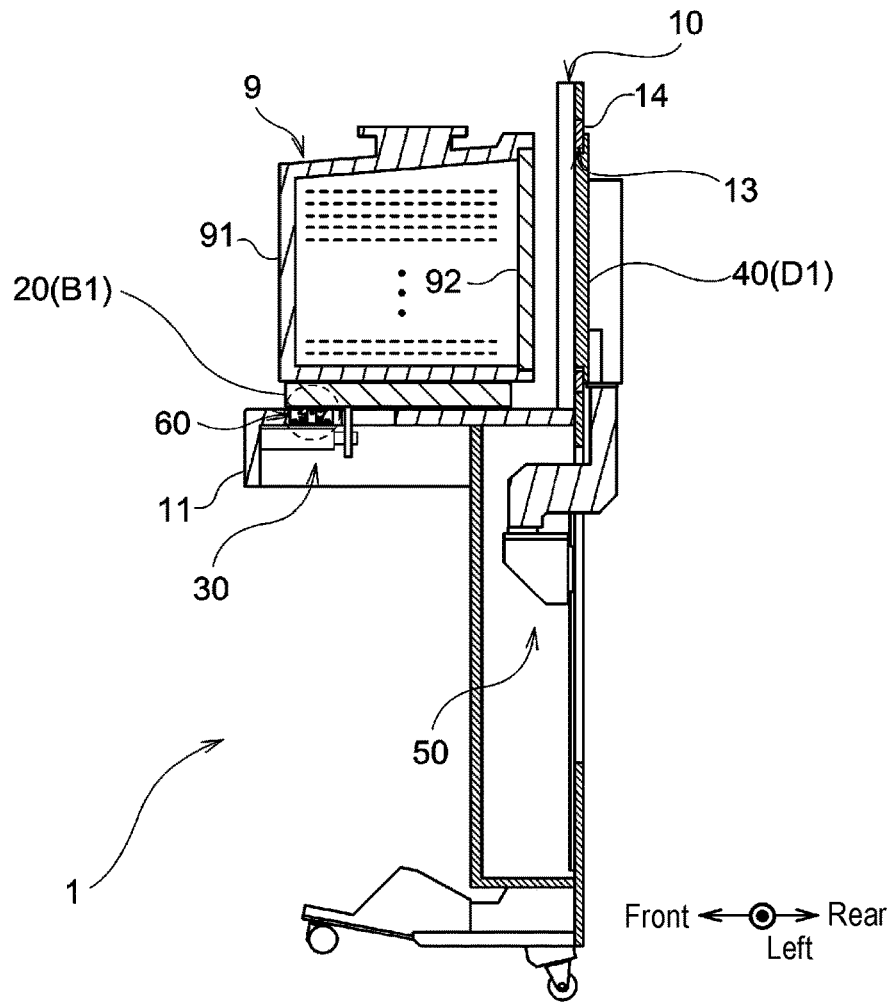
FIGS. 10A and 10B are views illustrating the load port viewed from a side in an operation state.

First, in a state in which the stage 20 is disposed at the separation position B1 and the door 40 is disposed at the closing position D1, a storage container 9 (e.g., a storage container 9 storing unprocessed wafers 90) is transported by an external robot such as an AMHS or a PGV and mounted on the stage 20 (FIG. 10A). The storage container 9 mounted on the stage 20 is guided by positioning pins 21 provided on the stage 20 and positioned at a predetermined position. In addition, the locking part 22 provided on the stage 20 is engaged with a fixed portion provided on the bottom surface of the storage container 9, so that the storage container 9 is fixed to the stage 20 at the predetermined position. Thereafter, if necessary, a predetermined gas is purged into the storage container 9 from the gas nozzles 23 through the gas supply valves, and the gas inside the storage container 9 is discharged from other gas nozzles 23 through the gas discharge valves, so that the gas inside the storage container 9 is replaced with the predetermined gas, and the pressure inside the storage container 9 is adjusted to a predetermined value.

Figure 10B:
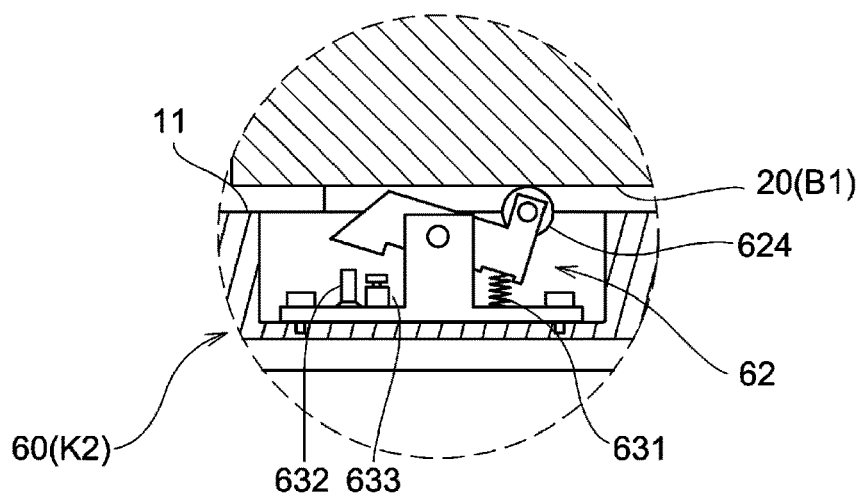

In the state in which the stage 20 is disposed at the separation position B1, the movement restricting part 60 is located to overlap the stage 20 in a plan view, and the rotary part 62 is pressed by the elastic member 631 in the first rotating direction R1, the roller 624 is in the state of abutting against the bottom surface of the stage 20 (FIG. 10B). That is, the movement restricting part 60 is in the releasing state K2 in which the upper end of the roller 624 is at the same height as the lower end surface of the stage 20 and the movement of the stage 20 is not hindered.

Step S2: Stage Moving Operation

Figure 11A:
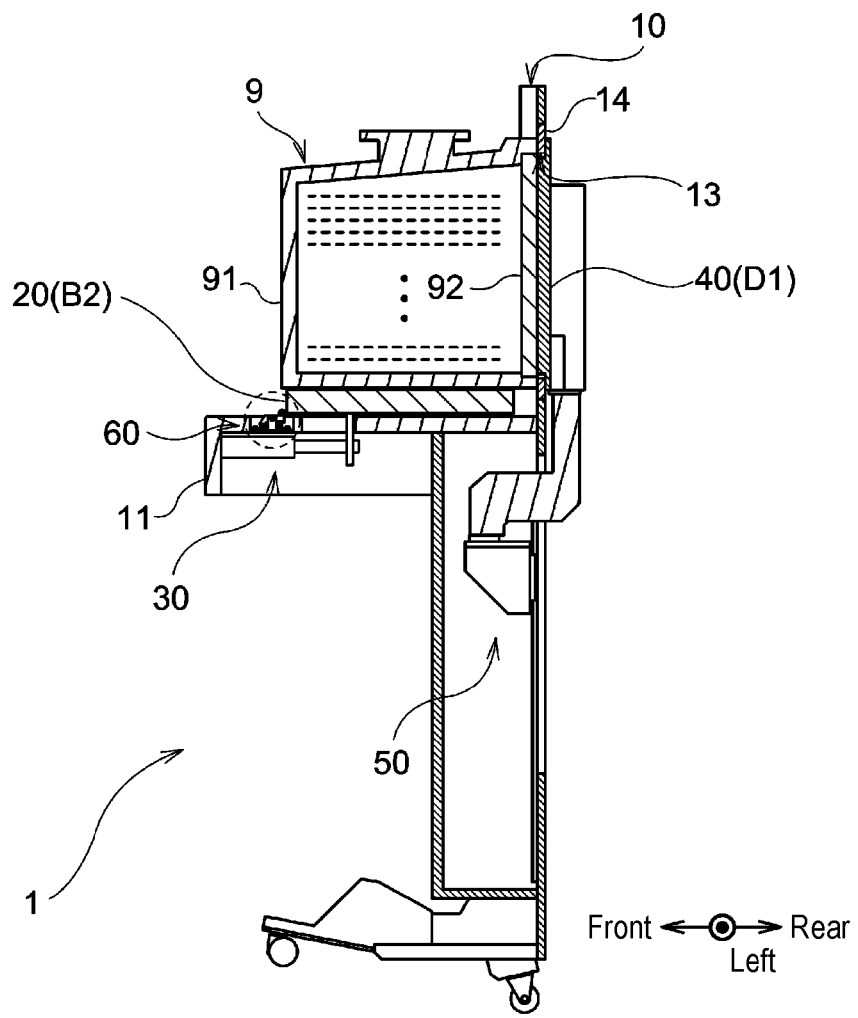
FIGS. 11A and 11B are views illustrating the load port viewed from a side in an operation state.

When the storage container 9 is placed on the stage 20, the stage driving mechanism 30 moves the stage 20 from the separation position B1 to the docking position B2 (FIG. 11A). That is, the stage driving mechanism 30 moves the stage 20 in a direction approaching the base (rearward) to bring the opening 13 (and thus the door 40 closing the opening 13) provided in the base 10 and the lid 92 close to each other. In the state in which the stage 20 is disposed at the docking position B2, the jaw 911 of the storage container 9 mounted on the stage 20 abuts on the base 10 (specifically, the window unit 14) (docking).

Here, the state of the movement restricting part 60 when the operation of step S2 is performed will be described. For a while after the stage driving mechanism 30 starts to move the stage 20 disposed at the separation position B1 rearward, the front end surface 24 of the stage is still in front of the roller 624 of the movement restricting part 60 (the state indicated by the dashed line in FIG. 11B). In this state, when the movement restricting part 60 is in the releasing state K2 and the stage 20 moves backward, the roller 624 rolls while abutting against the bottom surface of the stage 20, thereby moving forward relative to the stage 20. Therefore, the movement of the stage 20 is not hindered by the movement restricting part 60.

When the rearward movement of the stage 20 progresses and the front end surface 24 of the stage 20 reaches the position of the roller 624 (the state indicated by the two-dot chain line in FIG. 11B), the bottom surface of the stage 20 that has been pressing the roller 624 from above disappears thereafter. Therefore, the rotary part 62 rotates in the first rotating direction R1 due to the pressing force of the elastic member 631. This rotation is stopped when the stopper 632 abuts against the abutment portion 622. As a result, the rotary part 62 assumes a posture in which the upper end of the roller 624 is disposed above the lower end of the front end surface 24 of the stage 20 (the state indicated by the solid line in FIG. 11B). That is, the movement restricting part 60 enters the restricting state K1 in which the movement of the stage 20 can be restricted. That is, when the front end surface 24 of the stage 20 reaches the position of the roller 624, the rotary part 62 is rotated in the first rotating direction R1 by being processed by the elastic member 631, and the movement restricting part 60 is switched from the releasing state K2 to the restricting state K1.

Figure 11B:
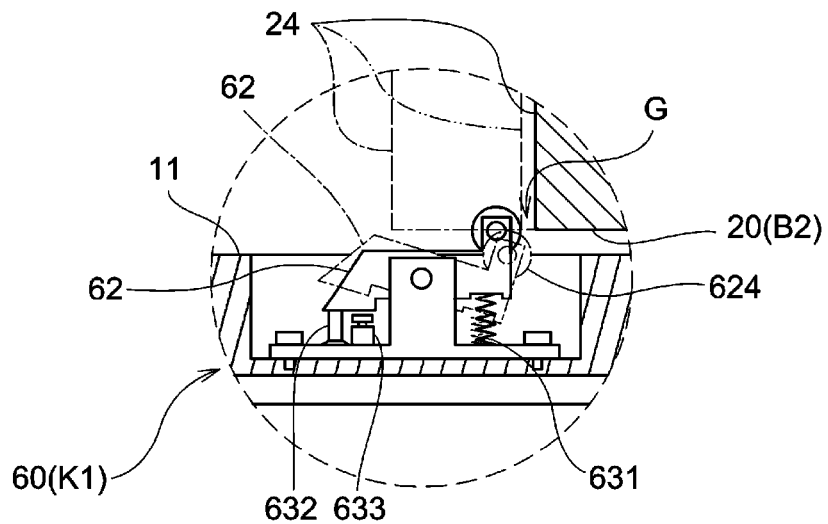

Thereafter, the stage 20 is moved further rearward by a small distance and disposed at the docking position B2 (the state indicated by the solid line in FIG. 11B). Since the stage 20 moves further rearward by a small distance and is disposed at the docking position B2 after the movement restricting part 60 is switched to the restricting state K1, a slight gap G is provided between the front end surface 24 disposed at the docking position B2 and the roller 624. That is, the movement restricting part 60 is provided at a position in front of the stage 20 disposed at the docking position B2 (more specifically, the position where the roller 624 is disposed in front of the front end surface 24 of the stage 20 disposed at the docking position B2 while providing a slight gap G between the roller 624 and the front end surface 24 of the stage 20).

Step S3: Lid Holding Operation

When the stage 20 is disposed at the docking position B2, the lid holding mechanism 41 subsequently causes the door 40 to hold the lid 92. That is, in the state in which the stage 20 is disposed at the docking position B2 and the jaw 911 of the storage container 9 mounted on the stage 20 abuts on the window unit 14, the lid 92 of the storage container 9 enters into a state of abutting on or being sufficiently close to the door 40 which closes the opening 13 (i.e., being disposed at the closing position D1) (at least the lid holding mechanism 41 comes close to the door 40 to the extent that the lid 92 can be held by the lid holding mechanism 41). In this state, the lid holding mechanism 41 connects and integrates the lid 92 and the door 40, and causes the lid 92 to be held by the door 40. In addition, the lid holding mechanism 41 releases the latching between the container main body 91 and the lid 92 of the storage container 9.

Step S4: Opening Operation

Figure 12A:
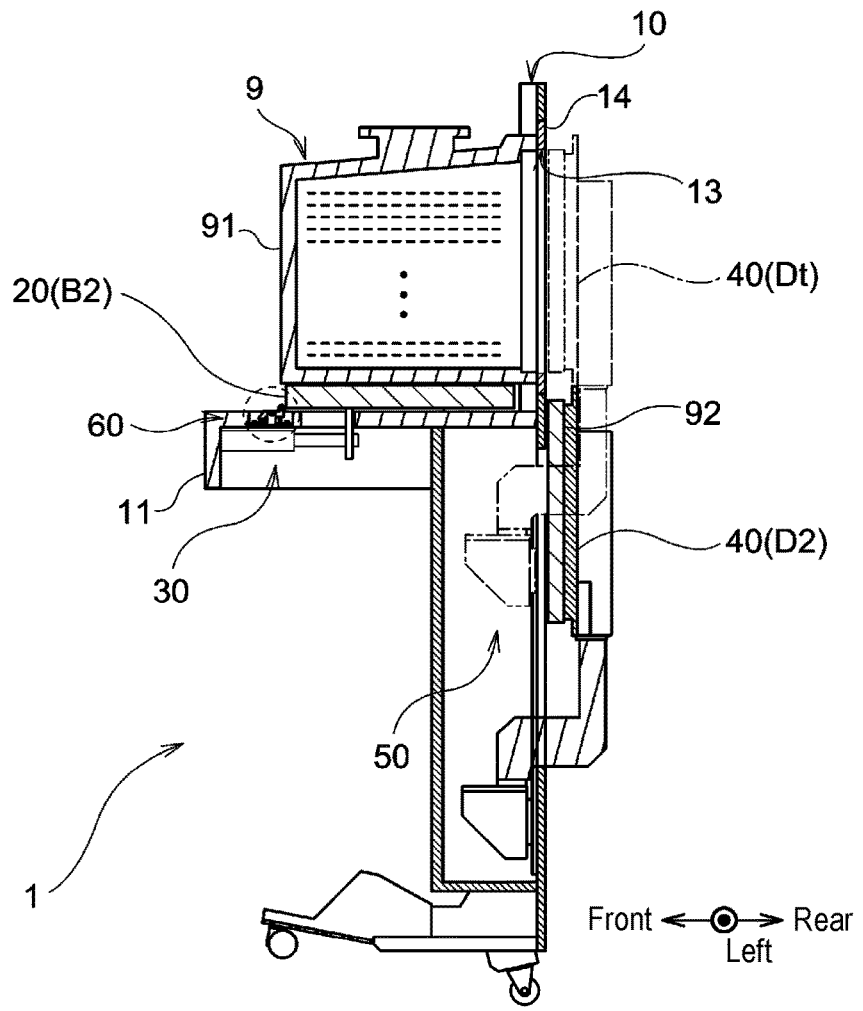
FIGS. 12A and 12B are views illustrating the load port viewed from a side in an operation state.
Figure 12B:
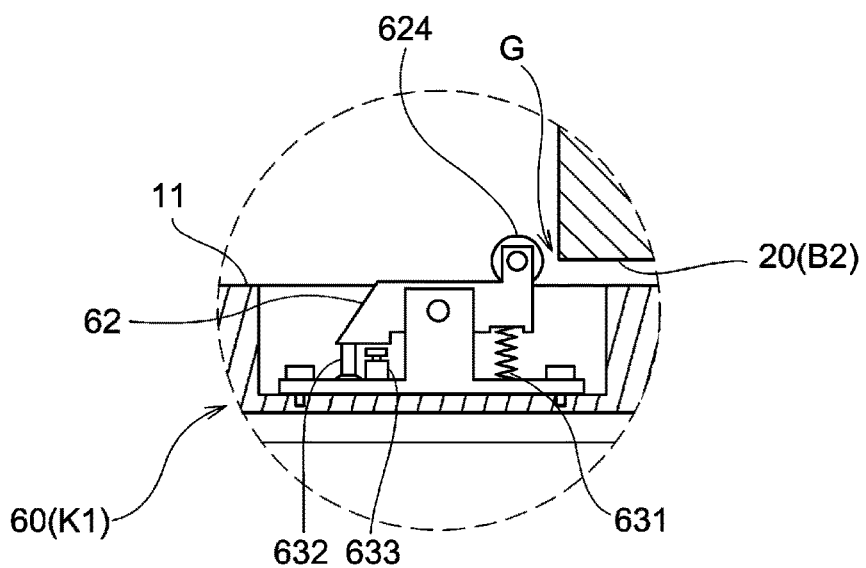

Subsequently, the door driving mechanism 50 moves the door 40 together with the lid 92 held by the door 40 from the closing position D1 to the opening position D2 (FIG. 12A). Specifically, the door driving mechanism 50 moves the door 40 located at the closing position D1 rearward to be disposed at the motion conversion position Dt and lowers the door 40 therefrom to the opening position D2. As a result, the opening 13 is opened, and the inside of the container main body 91 communicates with the transport space V through the opening 13. When this state is established, the transport robot 82 disposed in the transport space V takes out the wafers 90 stored in the container main body 91 and carries the wafers 90 into the processing apparatus M. In addition, the transport robot 82 carries out the wafers 90 that have been subjected to a predetermined process in the processing apparatus M from the processing apparatus M and stores the wafers 90 in the container main body 91.

Step S5: Closing Operation

When a predetermined number of wafers 90 are stored in the container main body 91, the door driving mechanism 50 moves the door 40 together with the lid 92 held by the door 40 from the opening position D2 to the closing position D1

Figure 13A:
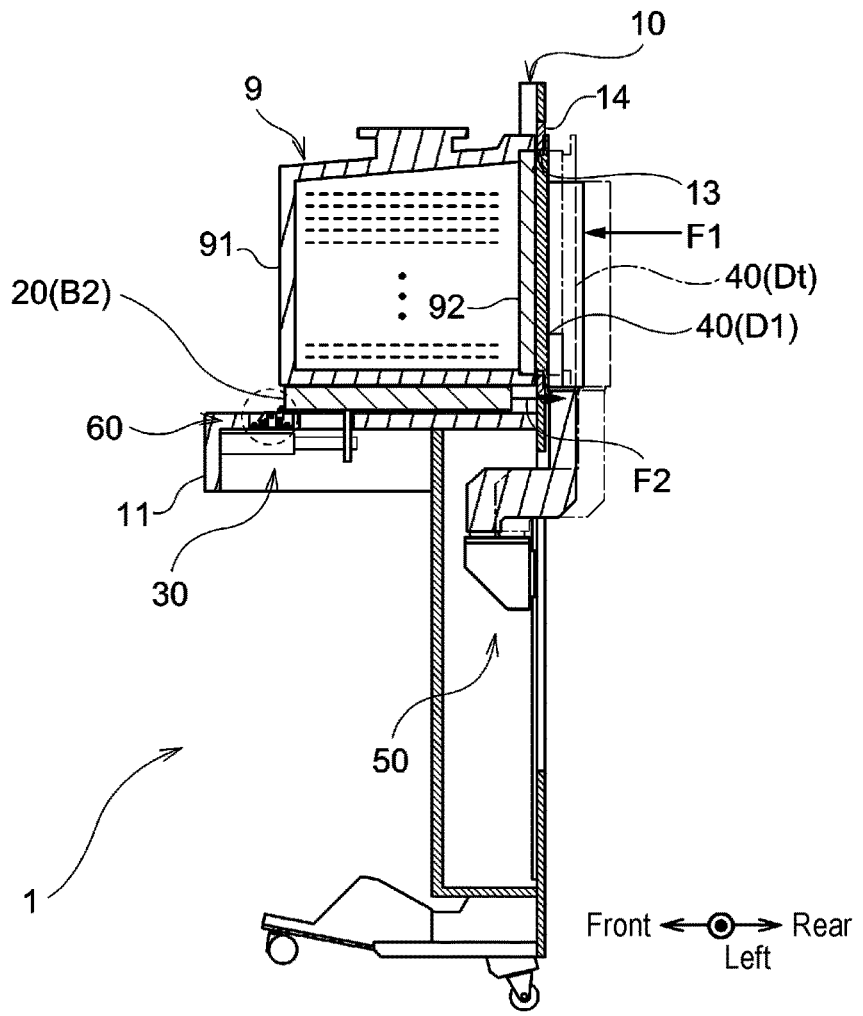
FIGS. 13A and 13B are views illustrating the load port viewed from a side in an operation state.

(FIG. 13A). Specifically, the door driving mechanism 50 raises the door 40 from the opening position D2 to dispose the door 40 at the motion conversion position Dt, and moves the door 40 forward therefrom to the closing position D1. When the door 40 is moved forward, the door 40 is pressed toward the opening 13. As a result, the lid 92 held by the door 40 is attached to the container main body 91 while the retainers 921 (FIG. 6) provided on the inward surface of the lid 92 are elastically deformed and press the wafers 90.

Here, when the lid 92 is attached to the container main body 91, the force (door closing force) F1 in which the door driving mechanism 50 presses the door 40 toward the opening 13 (that is, forward) is set to a magnitude that exceeds at least the reaction force of the retainers 921. On the other hand, when the lid 92 is attached to the container main body 91, the force (docking force) F2 in which the stage driving mechanism 30 presses the stage 20 toward the base 10 (that is, rearward) is smaller than the door closing force F1 (F2<F1).

Figure 13B:
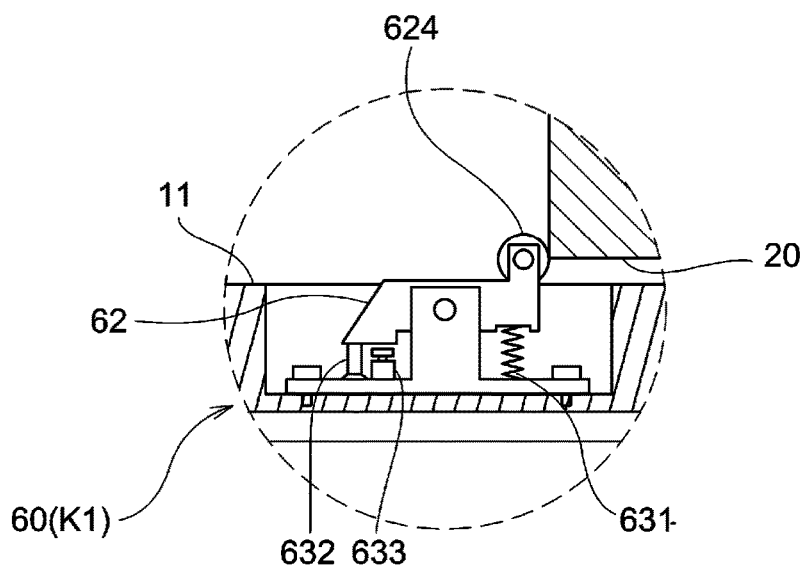

Therefore, when the lid 92 is attached to the container main body 91, the container main body 91 is pushed forward by the lid 92 held by the door 40, and the stage 20 to which the container main body 91 is fixed is to move forward (i.e., in the direction away from the base 10). However, here, the movement restricting part 60 (i.e., the movement restricting part 60 in the restricting state K1) abuts against the stage 20 that is to move forward and restricts the forward movement of the stage 20 (step S51: movement restricting operation). Specifically, when the stage 20 moves forward by a small distance corresponding to the gap G, the roller 624 of the rotary part 62 abuts against the front end surface 24 of the stage 20 (FIG. 13B). Then, the stage 20 cannot move forward any more (the movement is restricted) and stops. That is, the stage 20 moves forward by a small distance corresponding to the gap G but does not move further. Therefore, the lid 92 is easily attached to the container main body 91 mounted on the stage 20.

Step S6: Lid Holding Releasing Operation

When the lid 92 is attached to the container main body 91, the lid holding mechanism 41 is latched between the container main body 91 and the lid 92. In addition, the lid holding mechanism 41 releases the connection between the door 40 and the lid 92 to separate the door 40 and the lid 92 (releasing the holding state). After the lid 92 is attached to the container main body 91, when the door closing force F1 disappears or is reduced, the stage 20, which has been pushed slightly forward from the docking position B2, returns to the docking position B2 again by the docking force F2 of the stage driving mechanism 30 or the like.

Step S7: Stage Moving Operation

Figure 14A:
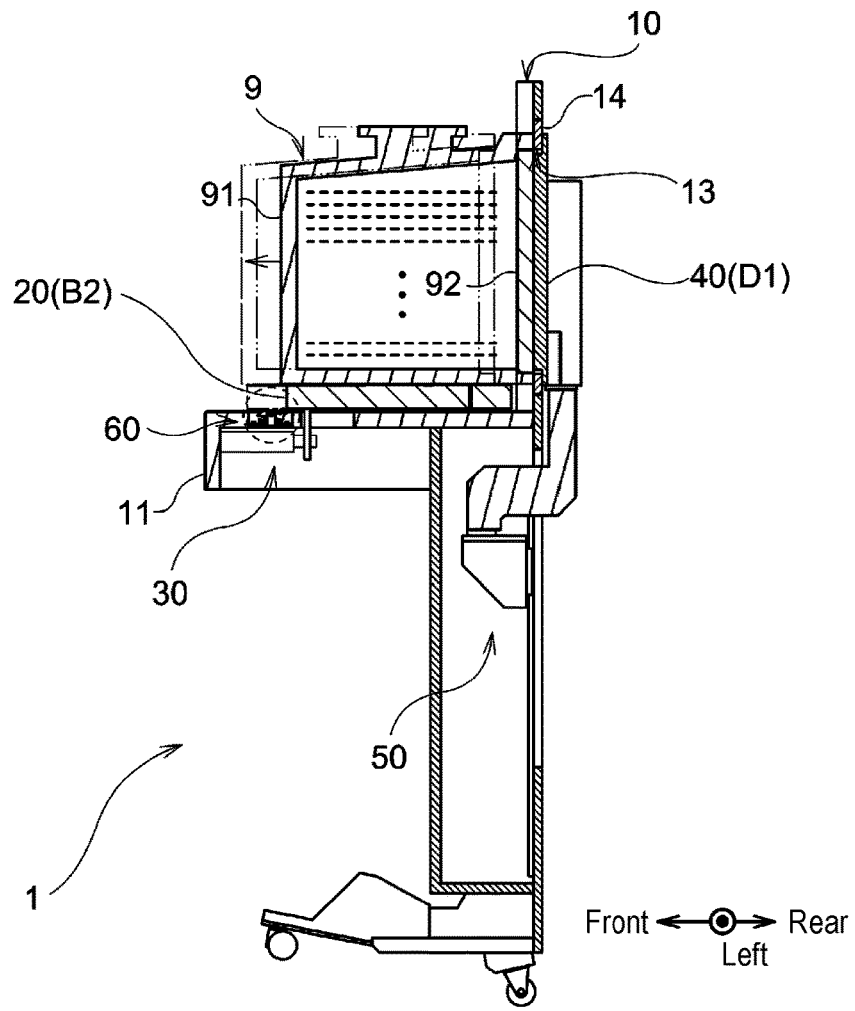
FIGS. 14A and 14B are views illustrating the load port viewed from a side in an operation state.
Figure 14B:
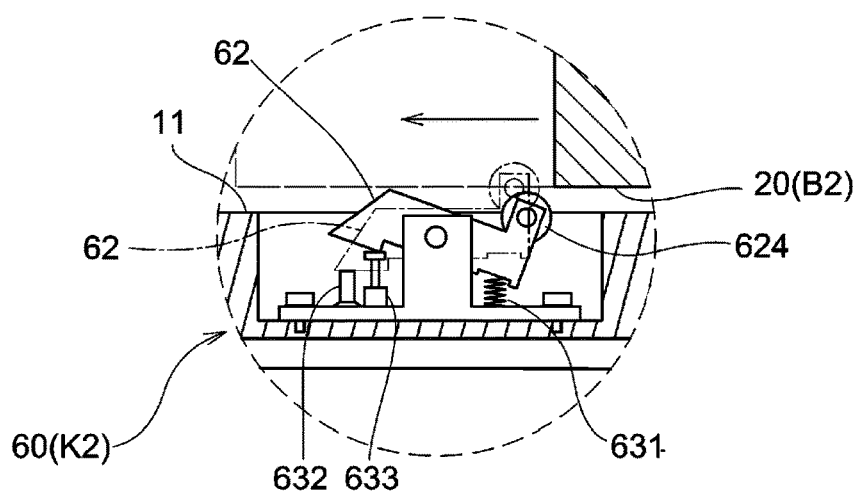
Figure 15:
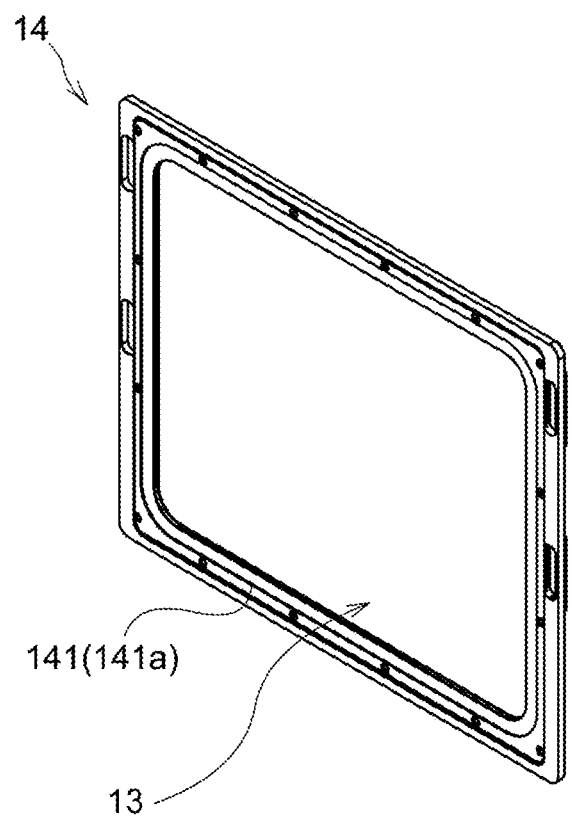
FIG. 15 is a perspective view illustrating the configuration of a window unit.

Subsequently, the stage driving mechanism 30 moves the stage 20 from the docking position B2 to the separation position B1 (FIG. 14A).

Here, the state of the movement restricting part 60 when the operation of step S7 is performed will be described. The movement restricting part 60 is switched from the restricting state K1 to the releasing state K2 before the stage 20 starts to move. Specifically, for example, when a sensor (not illustrated) detects that the lid 92 is attached to the container main body 91, the controller 70 sends a predetermined instruction to the solenoid 633b of the pressing part 633, and the solenoid 633b raises the rod 633a (moving the rod 633a in the direction away from the base part 61) in response to the predetermined instruction. Then, the abutment portion 622 is pushed up by the rod 633a, and the rotary part 62 rotates in the second rotating direction R2. Since a slight gap G is provided between the front end surface 24 of the stage 20 disposed at the docking position B2 and the roller 624, the rotary part 62 is rotatable without interfering with the stage 20. By rotating the rotary part 62 in the second rotating direction R2, the upper end of the roller 624 is disposed below the lower end of the front end surface 24 of the stage 20. As a result, the movement restricting part 60 enters the releasing state K2 in which the movement of the stage 20 is not restricted. That is, the movement restricting part 60 switches from the restricting state K1 (the state indicated by the one-dot chain line in FIG. 14B) to the releasing state K2 (the state indicated by the solid line in FIG. 14B).

Thereafter, the stage driving mechanism 30 allows the stage 20 disposed at the docking position B2 to start to move forward. At this time, since the movement restricting part 60 is in the releasing state K2, the roller 624 does not interfere with the stage 20 even if the stage 20 moves rearward. Therefore, the movement of the stage 20 is not hindered by the movement restricting part 60.

At an appropriate time after the stage 20 starts to move forward, the pressing part 633 releases the pressing of the rotary part 62. Specifically, the controller 70 sends a predetermined instruction to the solenoid 633b, and the solenoid 633b lowers the rod 633a (moving the rod toward the base part 61) in response to the predetermined instruction. Then, the rotary part 62 is slightly rotated in the first rotating direction R1 by the pressing force of the elastic member 631, and the roller 624 enters a state of abutting against the bottom surface of the stage 20 (see FIG. 10B). That is, even if the pressing part 633 releases the pressing on the rotary part 62, the movement restricting part 60 is maintained in the releasing state K2. Needless to say, after the pressing on the rotary part 62 by the pressing part 633 is released, when the stage 20 moves forward, the roller 624 rolls while abutting against the bottom surface of the stage 20, thereby moving rearward relative to the stage 20. Therefore, the movement of the stage 20 is not hindered by the movement restricting part 60.

Step S8: Storage Container Carry-Out Operation

When the stage 20 is disposed at the separation position B1, the locking part 22 provided on the stage 20 is disengaged, and the fixing of the storage container 9 to the stage 20 is released. Thereafter, the storage container 9 is carried out by an external robot.

6. Effect

A load port 1 according to the above-described embodiment includes: a plate-shaped base that constitutes a portion of a wall of the transport part 8; a stage 20 on which the storage container 9 is mounted; a stage driving mechanism 30 configured to move the stage 20 in a direction toward or away from the base 10; a door 40 configured to be capable of opening/closing an opening 13 provided in the base 10 at a position facing a lid 92 of a storage container 9 mounted on the stage 20 and to be capable of holding the lid 92 disposed to face the opening 13 in a state of closing the opening 13; a door driving mechanism 50 configured to move the door 40 between an opening position D2 where the door 40 opens the opening 13 and a closing position D1 where which the door 40 closes the opening 13; and a movement restricting part 60 configured to restrict the movement of the stage 20 in the direction away from the base by abutting against the stage 20 when the door 40 is pressed toward the opening 13 and the lid 92 held by the door 40 is attached to the container main body 91.

With this configuration, for example, when the lid 92 held by the door 40 is attached to the container main body 91, since a force (a docking force) F2 that presses the stage 20 toward the base 10 is smaller than a force (a door closing force) F1 that presses the door 40 toward the opening 13, even if the stage 20 is to move in the direction away from the base 10, the movement restricting part 60 abuts against the stage 20, thereby restricting the movement of the stage 20 so that the lid 92 can be attached to the container main body 91 mounted on the stage 20. That is, the lid 92 can be attached to the container main body 91 even if the docking force F2 is not a large force that balances with the door closing force F1. Therefore, it is possible to reduce the docking force F2 so that applying an excessive force which causes deformation to the door 40 can be avoided. As a result, deformation of the door 40 can be avoided. Moreover, it is possible to avoid a situation in which the lid 92 is not attached to the container main body 91 and comes off due to deformation of the door 40.

If opening/closing of the storage container 9 is to be implemented by balancing the docking force F2 with the door closing force F1, the two forces F1 and F2 are defined such that the storage container 9 and the door 40 mounted on the stage 20 have a positional relationship of slightly overlapping each other in a front-rear direction when the lid 92 held by the door 40 is attached to the container main body 91. For example, the door closing force F1 is defined to have a magnitude that pushes the door 40 forward beyond an intermediate position, and the docking force F2 is defined to have a magnitude that causes the stage 20 to push the storage container 9 mounted on the same to push the door 40 rearward beyond the intermediate position. Therefore, bending is likely to occur in one or both of the storage container 9 and the door 40. In contrast, in the case of the configuration in which the movement restricting part 60 is provided, as described above, it is possible to make the docking force F2 smaller than the door closing force F1, so that the bending is less likely to occur in the storage container 9 and the door In addition, in order to balance the docking force F2 with the door closing force F1, it is necessary to strictly adjust each driving mechanism. However, when the movement restricting part 60 is provided, such strict adjustment is also unnecessary.

In addition, when the docking force F2 is sufficiently small, since the abutment force between the storage container 9 mounted on the stage 20 disposed at the docking position B2 and the base 10 (specifically, between the jaw 911 and the window unit 14) is sufficiently small, a serious problem is unlikely to occur even if a foreign object or the like is pinched between the storage container 9 and the base 10. Therefore, a sensor or the like for preventing or detecting pinching may be omitted. In addition, when the docking force F2 is sufficiently small to ensure that the door 40 is not deformed, a sensor for detecting that the door 40 is deformed (or an operation for detecting the same) may be omitted. Furthermore, a sensor for detecting that the lid 92 has come off without being attached to the container main body 91 (or an operation for detecting the same this) may also be omitted.

When the docking force F2 is relatively small, the transport space V is preferably maintained at a slightly higher pressure than the outside. That is, when the docking force F2 is relatively small, it is difficult to maintain the airtightness between the storage container 9 and the base 10 (specifically, between the jaw 911 and the window unit 14) in the state in which the stage 20 is disposed at the docking position B2. However, when the transport space V is maintained at a slightly higher pressure than the outside, even if a gap is formed between the storage container 9 and the base 10, outside air does not flow in through the gap. Therefore, degradation of the cleanliness of the transport space V is avoided. For similar reasons, the inside of the container main body 91 is preferably maintained at a slightly higher pressure than the outside.

In the load port 1 according to the above-described embodiment, the movement restricting part 60 abuts against the stage 20 at a center position of the stage 20 in a direction (a left-right direction) perpendicular to the moving direction (a front-rear direction) of the stage 20 in a plan view. With this configuration, a force that rotates the stage 20 to left and right is less likely to act on the stage 20. Therefore, the movement of the stage 20 in the direction away from the base 10 can be stably restricted.

In the load port 1 according to the above-described embodiment, the movement restricting part 60 is switched between a restricting state K1 of restricting the movement of the stage 20 by abutting against the stage 20 and a releasing state K2 of not restricting the movement of the stage 20. With this configuration, the restriction of the movement of the stage 20 or the releasing of the restriction can be easily and reliably performed.

In the load port 1 according to the above-described embodiment, the movement restricting part 60 includes: a rotary part 62 provided to be rotatable around a rotary shaft 621 extending along a direction intersecting the moving direction of the stage 20; and a switching part 63 configured to switch between the restricting state K1 and the releasing state K2 by rotating the rotary part 62. With this configuration, the restriction of the movement of the stage 20 and the releasing of the movement can be implemented with a simple configuration.

In the load port 1 according to the above-described embodiment, the switching part 63 includes: an elastic member 631 configured to press the rotary part 62 in a first rotating direction R1; and a pressing part 633 configured to press the rotary part 62 in response to an instruction from the controller 70 to rotate the rotary part 62 in a second rotating direction R2 opposite to the first rotating direction R1. The movement restricting part 60 is switched from the releasing state K2 to the restricting state K1 when the rotary part 62 is rotated in the first rotating direction R1 by being pressed by the elastic member 631, and is switched from the restricting state K1 to the releasing state K2 when the rotary part 62 is rotated in the second rotating direction R2 by being pressed by the pressing part 633. With this configuration, since the switching from the releasing state K2 to the restricting state K1 is performed by using the pressing force of the elastic member 631, the processing load on the controller 70 can be reduced.

In the load port 1 according to the above-described embodiment, a slight gap G is provided between the rotary part 62 and the front end surface 24 of the stage 20 disposed at the docking position B2. With this configuration, when the rotary part 62 rotates to switch from the restricting state K1 to the releasing state K2, the situation in which the rotary part 62 interferes with the stage 20 is unlikely to occur. Moreover, it is possible to deal with storage containers 9 having different sizes.

In the load port 1 according to the above-described embodiment, when the door 40 is pressed toward the opening 13 and the lid 92 held by the door 40 is attached to the container main body 91, the force (docking force) F2 with which the stage driving mechanism 30 presses the stage 20 toward the base 10 is smaller than the force (door closing force) F1 with which the door driving mechanism 50 presses the door 40 toward the opening 13. With this configuration, it is possible to sufficiently avoid applying an excessive force, which causes deformation, to the door 40.

A method for opening/closing a storage container 9 according to the above-described embodiment includes: a stage moving operation of moving a stage 20 on which the storage container 9 that stores substrates, such as wafers 90, in a direction toward the base 10 to bring the opening 13 provided in the base 10 at a position facing the lid 92 of the storage container 9 mounted on the stage 20 and the lid 92 closer to each other (step S2); a lid holding operation of causing the door 40 closing the opening 13 to hold the lid 92 disposed to face the opening 13 (step S3); an opening operation of moving the door 40 together with the lid 92 held by the door from the closing position D1 where the door 40 closes the opening 13 to the opening position D2 where the door 40 opens the opening 13 (step S4); a closing operation of moving the door 40 together with the lid 92 held by the door 40 from the opening position D2 to the closing position D1 (step S5); and a movement restricting operation of causing the movement restricting part 60 to restrict the movement of the stage 20 in a direction away from the base 10 by abutting against the stage 20 when the door 40 is pressed toward the opening 13 and the lid 92 held by the door is attached to the container main body 91 in the closing operation (step S51).

With this configuration, when the lid 92 held by the door 40 is attached to the container main body 91, the movement restricting part 60 abuts against the stage 20, thereby restricting the movement of the stage 20. Therefore, it is possible to reduce the docking force F2 so that applying an excessive force, which causes deformation to the door 40, can be avoided.

7. Other Embodiments

<7-1. Seal Member>

In the load port 1 according to the above-described embodiment, the window unit 14 having a window frame shape is attached to the base 10 to surround the opening 13, and the window unit 14 and the storage container 9 mounted on the stage 20 abut on each other in the state in which the stage 20 is disposed at the docking position B2. Here, as illustrated in FIG. a seal member 141 may be disposed on the front surface of the window unit 14 to surround the opening 13. With this configuration, in the state in which the stage 20 is disposed at the docking position B2, the storage container 9 (specifically, the jaw 911) mounted on the stage 20 and the window unit 14 are airtightly connected via the seal member 141. A similar seal member 141 may be provided on the rear surface of the window unit 14 as well.

Figure 16A:
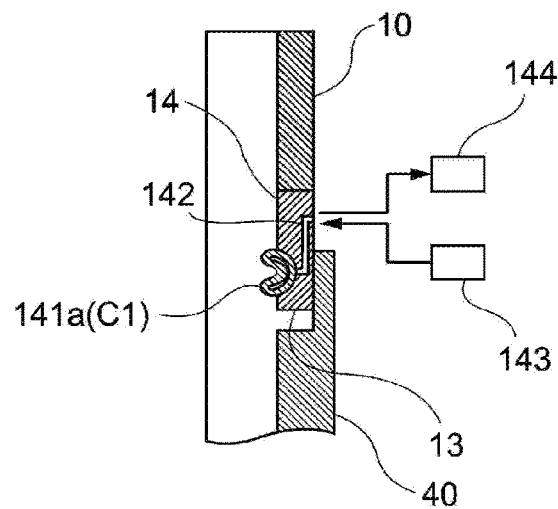
FIGS. 16A to 16C are side views for explaining a seal member provided on the window unit.
Figure 16B:
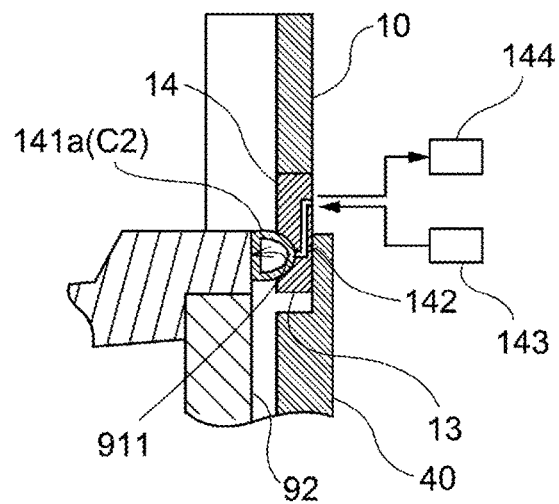
Figure 16C:
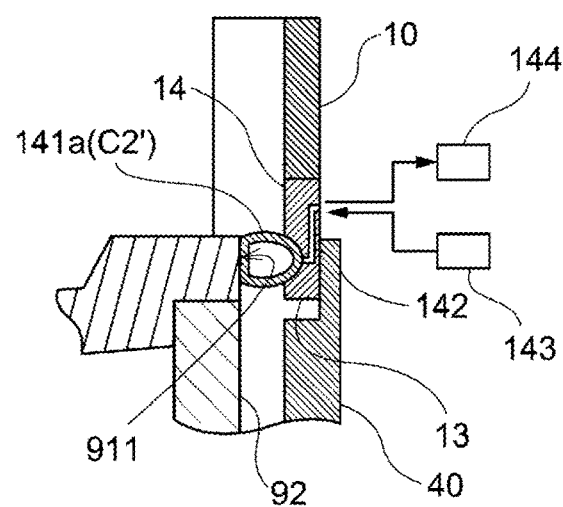

When the window unit 14 is provided with the seal member 141, as illustrated in FIGS. 16A to 16C, a hollow seal member (hollow elastic seal member) 141a formed of an elastic member is preferably used as the seal member 141. In this case, a groove is provided in the front surface of the window unit 14 to surround the periphery of the opening 13, and the hollow elastic seal member 141a is attached along the groove in a state in which a portion of the elastic seal member 141a is housed in the groove in the circumferential direction and the remaining portion is exposed from the groove. When the hollow elastic seal member 141a is provided, a flow path 142, which communicates with the hollow portion of the hollow elastic seal member 141a, is bored in the window unit 14, and a fluid supplier 143 configured to feed a predetermined fluid (e.g., nitrogen gas, dry air, dry nitrogen gas, and the like) and a fluid discharger 144 configured to discharge the fluid from the flow path 142 are provided. The fluid supplier 143 may include a pipe connected to a supply source that supplies a predetermined fluid, an opening/closing valve interposed in the pipe, and the like. In addition, the fluid discharger 144 may include a pipe connected to a pump, an opening/closing valve interposed in the pipe, and the like.

In such a configuration, when the fluid in the hollow portion of the hollow elastic seal member 141a is discharged from the fluid discharger 144 through the flow path 142, the pressure in the hollow portion is reduced and the hollow elastic seal member 141a enters a contracted state C1 (FIG. 16A). On the other hand, when the fluid is supplied from the fluid supplier 143 to the hollow portion of the hollow elastic seal member 141a through the flow path 142, the pressure in the hollow portion increases and the hollow elastic seal member 141a enters an inflated state C2 (e.g., FIG. 16B). In this way, the volume (the radial in the radial direction) of the hollow elastic seal member 141a may be changed by controlling the supply and discharge of the fluid to and from the hollow portion.

For example, when the fluid is supplied to the hollow portion of the hollow elastic seal member 141a to change the hollow elastic seal member 141a from the contracted state C1 to the expanded state C2, the hollow elastic seal member 141a comes into elastic contact with the jaw 911 of the storage container 9 mounted on the stage 20 disposed at the docking position B2 (FIG. 16B). As a result, the storage container 9 mounted on the stage 20 and the window unit 14 are airtightly connected to each other via the hollow elastic seal member 141a.

As in the above-described embodiment, when the movement restricting part 60 restricts the movement of the stage 20 at a position ahead of the docking position B2 by a distance corresponding to the gap G, the storage container 9 placed on the stage 20 may be spaced apart from the window unit 14 by a small distance corresponding to the gap G. In this regard, in the case where the hollow elastic seal member 141a is used as the seal member 141, if the fluid is added to the hollow portion at an appropriate time (or when the pressure in the hollow portion is sufficiently increased in advance), when the storage container 9 is slightly separated from the window unit 14, the hollow elastic seal member 141a is further expanded following into a follow-up expansion state C2' and continues to be in elastic contact with the jaw 911 of the storage container 9 (FIG. 16C). That is, even if the storage container 9 is spaced apart from the window unit 14 by the small distance corresponding to the gap G, the airtight connection between the window unit 14 and the storage container 9 is maintained.

Normally, in order to ensure airtightness between the window unit 14 and the storage container 9 via the seal member 141, a clamping member is provided to draw and hold the storage container 9 toward the window unit 14 such that the storage container 9 is not separated from the window unit 14. However, when the movement restricting part 60 is provided, since the movement restricting part 60 restricts the forward movement of the stage 20, it is ensured that the storage container 9 is not spaced apart from the window unit 14 by a certain amount or more (exceeding the small distance corresponding to the gap G). Therefore, airtightness via the seal member 141 can be ensured without providing such a clamping member.

<7-2. Lock Unit>

Figure 17A:
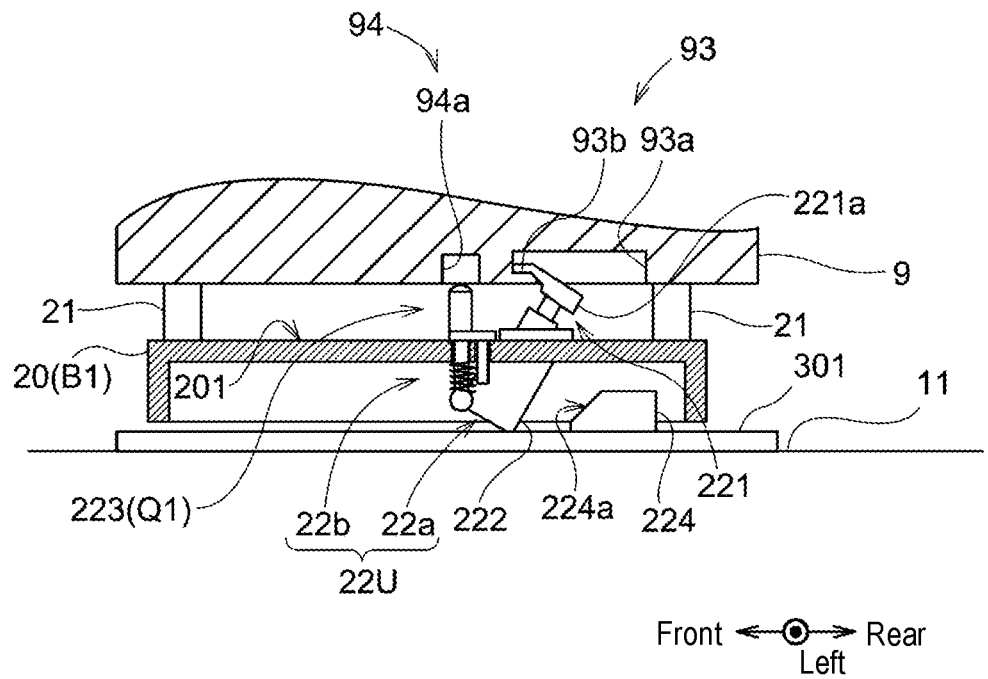
FIGS. 17A and 17B are schematic diagrams for explaining a lock unit.
Figure 17B:
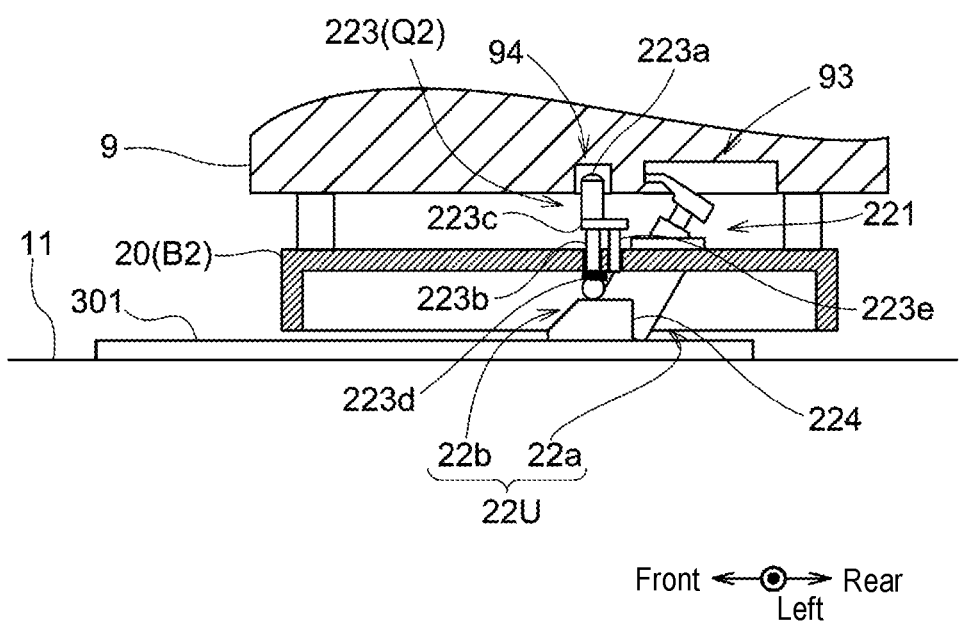
Figure 18:
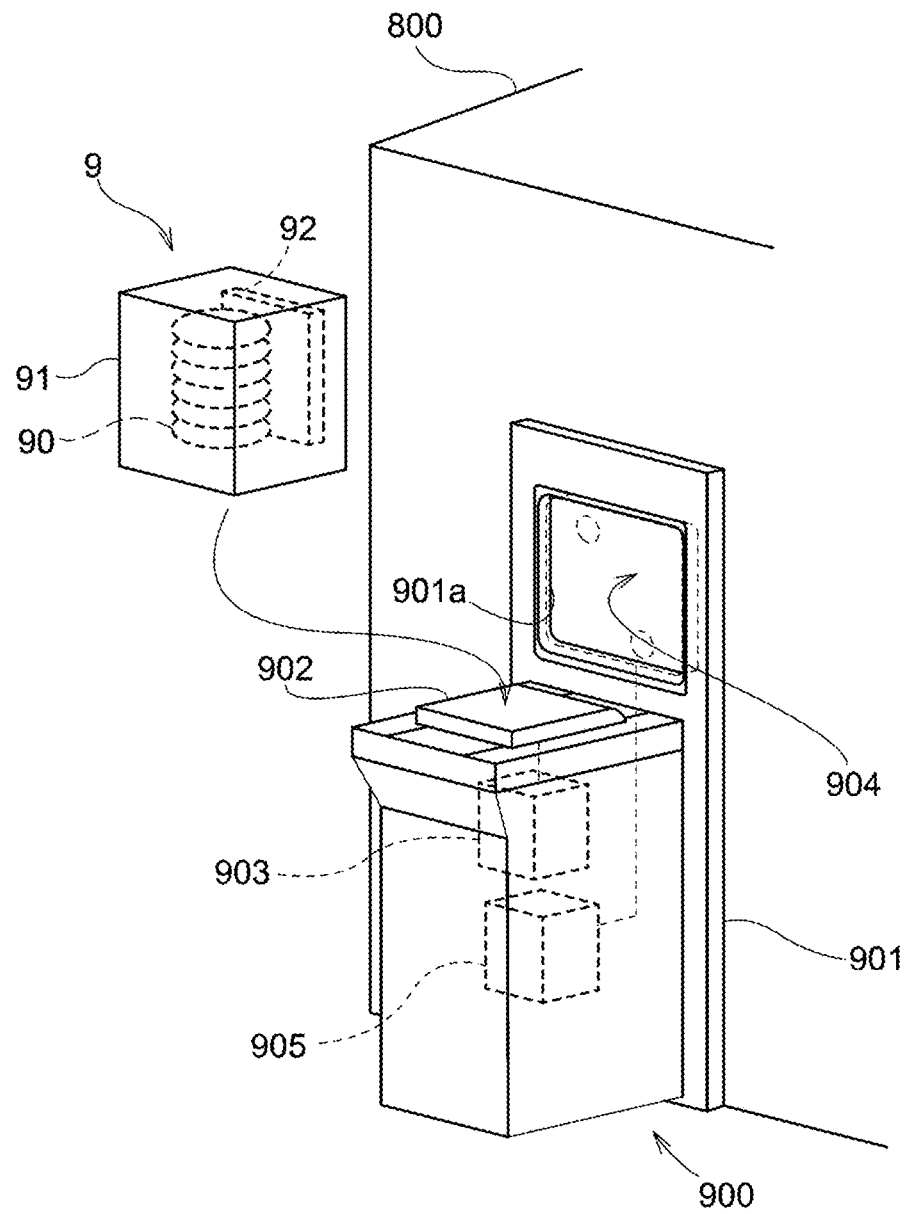
FIG. 18 is a view for explaining an EFEM according to an example in the related art.

In the load port 1 according to the above-described embodiment, a lock unit 22U may be provided as the locking part 22 provided in the stage 20. The configuration of the lock unit 22U will be specifically described with reference to FIGS. 17A and 17B. FIGS. 17A and 17B are schematic views for explaining the operation of the lock unit 22U provided in the stage 20.

Multiple types of retaining parts with different shapes are provided on the bottom surface of the storage container 9. One retaining part (first retaining part) 93 is also called a front retaining feature and is provided on the bottom surface of the storage container 9 on the side relatively close to the lid 92. The first retaining part 93 may include a recess 93a provided in the bottom surface of the storage container 9, and an engaging protrusion 93b protruding in a direction approaching the lid 92 from the edge of the recess 93a on the far side from the lid 92. The other retaining part (second retaining part) 94 is also called a center retaining feature and is provided substantially in the center of the bottom surface of the storage container 9 and at a position opposite to the lid 92 with the first retaining part 93 interposed therebetween. The second retaining part 94 includes a recess 94a.

The lock unit 22U includes: a first locking part 22a that is engaged with the first retaining part 93 and fixes the storage container 9, which is mounted at a predetermined position (the position positioned by the positioning pins 21) of the stage 20, at the predetermined position; and a second locking part 22b that is inserted into the second retaining part 94 to prevent the first locking part 22a from being disengaged from the first retaining part 93.

(First Locking Part 22a)

The first locking part 22a is a so-called bottom clamp and includes a clamping part 221 provided on the stage 20 and a driving part 222 configured to drive the clamping part 221 to switch its posture between a clamping posture and a releasing posture. The driving part 222 is implemented by an appropriate drive mechanism including a cylinder or the like. Here, the "clamping posture" is a posture in which the clamping part 221 clamps the engaging protrusion 93b of the first retaining part 93 of the storage container 9 mounted at a predetermined position on the stage 20, and more specifically, a posture in which a hook-shaped portion 221a provided at the tip of the clamping part 221 is engaged with the engaging protrusion 93b (the posture illustrated in FIGS. 17A and 17B). On the other hand, the "releasing posture" is a posture in which the clamping state of the clamping part 221 is released and the entire clamping part 221 is disposed outside the recess 93a (below the bottom surface of the storage container 9) (not illustrated).

When the clamping part 221 is in the clamping posture, the clamping part 221 is engaged with the engaging protrusion 93b, the bottom surface of the hook-shaped portion 221a and the top surface of the engaging protrusion 93b come into contact with each other, and the front end surface of the hook-shaped portion 221a and the rear end surface of the engaging protrusion 93b are in the state of abutting on each other. As a result, the storage container 9 mounted at the predetermined position on the stage 20 is fixed to the stage 20 at the predetermined position.

(Second Locking Part 22b)

The second locking part 22b includes a container separation prevention pin 223 provided on the stage 20 and a push-up block 224 provided on the top surface of a base pedestal 11.

The container separation prevention pin 223 includes an insertion portion 223a and a shaft portion 223b provided below the insertion portion 223a. The shaft portion 223b is inserted into a through hole provided in the stage 20. A connecting portion between the shaft portion 223b and the insertion portion 223a is provided with a flange 223c protruding in the radial direction, and the flange 223c is engaged with the periphery of the through hole in the mounting surface 201, so that the shaft portion 223b does not come off. A spring member 223d is provided on the lower portion of the shaft portion 223b (the portion that protrudes into the internal space of the stage 20) in a contracted state. By being pressed downward by the spring member 223d, the container separation prevention pin 223 is disposed at a lower position where the flange 223c abuts on the mounting surface 201 of the stage 20. At this time, the upper end of the insertion portion 223a is disposed at a position lower than the bottom surface of the storage container 9 mounted on the stage 20 (FIG. 17A). Hereinafter, this position of the container separation prevention pin 223 is also referred to as a "releasing position Q1".

When the container separation prevention pin 223 is pushed up by a push-up block 224, which will be described later, the flange 223c is disposed at an upper position where the flange 223c is spaced apart from the mounting surface 201. At this time, a portion or an entire of the insertion portion 223a is inserted into the recess 94a of the second retaining part 94 in the storage container 9 mounted at the predetermined position on the stage 20 (FIG. 17B). Hereinafter, this position of the container separation prevention pin 223 is also referred to as an "insertion position Q2". A guide portion 223e may be provided on the container separation prevention pin 223 to guide raising/lowering of the container separation prevention pin 223 so that the container separation prevention pin 223 is raised/lowered smoothly between the releasing position Q1 and the insertion position Q2. Specifically, for example, a guide portion 223e extending in parallel to the shaft portion 223b from below the flange 223c may be provided to be inserted into a guide hole provided in the stage 20. With this configuration, since the guide portion 223e is raised/lowered while being guided in the guide hole, the container separation prevention pin 223 is raised/lowered smoothly without axial wobbling.

The push-up block 224 is a substantially rectangular parallelepiped member, and a front end surface of the push-up block 224 is configured as an inclined surface 224a that inclines rearward as it approaches upward. The push-up block 224 is provided on the top surface of the base pedestal 11, specifically, for example, a linear guide (a linear guide configured to guide the stage 20 moved by the stage driving mechanism 30) 301 provided on the top surface of the base pedestal 11.

The push-up block 224 is spaced apart from the container separation prevention pin 223 and disposed at a position rearward of the container separation prevention pin 223 in the state in which the stage 20 is disposed at the separated position B1 (FIG. 17A). At this time, the container separation prevention pin 223 is disposed at the releasing position Q1 by being pressed downward by the spring member 223d. When the stage 20 is moved rearward from the separated position B1, the push-up block 224 provided on the base pedestal 11 moves forward relative to the stage 20 to approach the container separation prevention pin 223, and the lower end of the container separation prevention pin 223 (specifically, the lower end of the shaft portion 223b) and the inclined surface 224a of the push-up block 224 come into contact with each other. When the stage 20 is moved further rearward, the container separation prevention pin 223 is guided by the inclined surface 224a and pushed upward. When the stage 20 is disposed at the docking position B2, the container separation prevention pin 223 is in the state of abutting on the top surface of the push-up block 224, and at this time, the container separation prevention pin 223 is disposed at the insertion position Q2 (FIG. 17B).

In this way, when the stage 20 is moved from the separated position B1 to the docking position B2, the push-up block 224 provided on the base pedestal 11 pushes up the container separation prevention pin 223 provided in the stage 20. This switches the position of the container separation prevention pin 223 from the releasing position Q1 to the insertion position Q2. In contrast, when the stage 20 is moved from the docking position B2 to the separated position B1, the push-up block 224 is spaced apart from the container separation prevention pin 223, and the container separation prevention pin 223 is pressed downward by the spring member 223d, being switched from the insertion position Q2 to the releasing position Q1.

In the lock unit 22U having the above-described configuration, when the clamping part 221 of the first locking part 22a is in the clamping posture, the storage container 9 mounted at a predetermined position on the stage 20 is fixed to the stage 20 at the predetermined position. However, since the clamping part 221 abuts on the engaging protrusion 93b from the upper side and the rear side, the clamping part 221 is only fixed by the friction between the clamping part 221 and the engaging protrusion 93b when pulled forward. Therefore, if only the first locking part 22a is used, for example, when an operator intentionally applies a force that pulls the storage container 9 forward, the storage container 9 will move forward with respect to the stage 20 and the engaging protrusion 93b may be disengaged from the clamping part 221 (that is, the fixing of the storage container 9 to the stage 20 may be released), and the storage container 9 may be removed. However, in the lock unit 22U, when the stage 20 is disposed at the docking position B2, the container separation prevention pin 223 of the second locking part 22b is inserted into the recess 94a of the second retaining part 94. As a result, the storage container 9 is fixed not to move relative to the stage 20 in the front-rear direction. Therefore, for example, even if an operator intentionally pulls the storage container 9 forward, the storage container 9 cannot be removed. That is, with the lock unit 22U, intentional removal or the like of the storage container 9 by an operator can be prevented.

In addition, with the lock unit 22U, there is no need to provide a specific driving mechanism (an actuator) for moving the container separation prevention pin 223 of the second locking part 22b, so manufacturing costs can be reduced. However, in some cases, instead of the push-up block 224, a driving mechanism for moving the container separation prevention pin 223 may be provided. In this case, the driving mechanism is sufficient as long as it implements simple linear motion. Specifically, for example, the driving mechanism may be implemented by a solenoid, a cylinder (air cylinder), a linear motion mechanism including a feed screw and using a motor as a driving source, or the like.

For example, in the related arts, there has been a mechanism (so-called a center clamp mechanism) that clamps the second retaining part 94 with a T-shaped hook to fix the storage container 9 to the stage 20, but this mechanism is expensive since it clamps the second retaining part 94 by composite motions such as raising, rotating, and lowering. In addition, since the driving mechanism is downsized in order to perform the composite motions in a narrow space, the driving mechanism also has the drawback of being fragile. In contrast, since the lock unit 22U does not require a driving mechanism for performing such complicated operations, it is possible to achieve a low cost, downsizing, high durability, and the like.

8. Modifications

In the above-described embodiment, the switching part 63 of the movement restricting part 60 is provided with a solenoid (electromagnetic solenoid) 633b as a driving part for driving the pressing part 633. For example, the driving part that drives the pressing part 633 may be a cylinder (air (pneumatic) cylinder), or may be a linear motion mechanism including a feed screw and the like and using a motor as a driving source.

In the above-described embodiment, the movement restricting part 60 is provided with the switching part 63, but the specific configuration thereof is not limited to that exemplified in the above-described embodiment. For example, the tip of the rod 633a included in the pressing part 633 may be fixed to the rotary part 62. In this case, when the solenoid 633b lowers the rod 633a in response to an instruction from the controller 70, the rotary part 62 rotates in the first rotating direction R1, and the releasing state K2 is switched to the restricting state K1, and when the solenoid 633b raises the rod 633a in response to an instruction from the controller 70, the rotary part 62 rotates in the second rotating direction R2 and switches from the restricting state K1 to the releasing state K2. Needless to say, with such a configuration, the elastic member 631 and the stopper 632 can be omitted.

In the above-described embodiment, the movement restricting part 60 is switched between the releasing state K2 and the restricting state K1 by rotating the rotary part 62. However, the configuration of the movement restricting part 60 is not limited thereto. For example, the movement restricting part 60 may be configured to be switched between the releasing state K2 and the restricting state K1 by moving a block-shaped restricting member in a direction (for example, a left-right direction, an up-down direction, or the like) that intersects the moving direction of the stage 20. In this case, the driving mechanism that moves the restricting part is sufficient as long as it implements simple linear motion. Specifically, for example, the driving mechanism may be implemented by a solenoid, a cylinder (air cylinder), a linear motion mechanism including a feed screw and using a motor as a driving source, or the like.

In the above-described embodiment, the movement restricting part 60 restricts the movement of the stage 20 at a position in front of the docking position B2 by a distance corresponding to the gap G, but such a gap G is not essential. That is, the movement restricting part 60 may abut against the stage 20 disposed at the docking position B2 to restrict the movement of the stage 20 in a direction away from the base 10.

In the above-described embodiment, the movement restricting part 60 (specifically, the roller 624) abuts against the front end surface 24 of the stage 20 to restrict the forward movement of the stage 20. However, the movement restricting part 60 does not necessarily have to abut against the front end surface 24 of the stage 20. For example, a recess may be provided in the bottom surface or side surface of the stage 20, and the movement restricting part 60 may abut against the inner wall surface of the recess to restrict the movement of the stage 20.

Although only one movement restricting part 60 is provided in the above-described embodiment, a plurality of movement restricting parts 60 may be provided. For example, a plurality of movement restricting parts 60 may be arranged in a row in the left-right direction of the base pedestal 11 near the front end portion of the base pedestal 11.

In the above-described embodiment, the substrates stored in the storage container 9 are not necessarily the wafers 90, and may be, for example, wafers held on a tape frame (tape frame wafers), rectangular substrates, or the like. In addition, the storage container 9 does not necessarily have to be a FOUP, and may be, for example, a FOSB, a cassette, or the like.

Other configurations may also be modified in various ways without departing from the spirit of the present disclosure.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

EXPLANATION OF REFERENCE NUMERALS

100: EFEM, 1: load port, 10: base, 20: stage, 30: stage driving mechanism, 40: door, 50: door driving mechanism, 60: movement restricting part, 61: base part, 62: rotary part, 63: switching part, 631: elastic member, 632: stopper, 633: pressing part, 633b: solenoid

What is claimed is:

1. A load port connected to a transport part, the load port comprising:
    a plate-shaped base that constitutes a portion of a wall of the transport part;
    a stage on which a storage container is mounted;
        a stage driving mechanism configured to move the stage in a direction toward the base or in a direction away from the base;
        a door configured to be capable of opening/closing an opening provided in the base at a position facing a lid of the storage container mounted on the stage and to be capable of holding the lid disposed to face the opening in a state of closing the opening;
        a door driving mechanism configured to move the door between an opening position in which the door opens the opening and a closing position in which the door closes the opening; and
        a movement restricting part configured to restrict a movement of the stage in the direction away from the base by abutting against the stage when the door is pressed toward the opening and the lid held by the door is attached to a container main body of the storage container,
    wherein the movement restricting part is switched between a restricting state of restricting the movement of the stage by abutting against the stage and a releasing state of not restricting the movement of the stage.

2. The load port of claim 1, wherein the movement restricting part abuts against the stage at a center position of the stage in a direction perpendicular to a moving direction of the stage in a plan view.

3. The load port of claim 2, wherein the movement restricting part includes:
    a rotary part provided to be rotatable around a rotary shaft extending along a direction intersecting the moving direction of the stage; and
    a switching part configured to switch between the restricting state and the releasing state by rotating the rotary part.

4. The load port of claim 2, wherein, when the door is pressed toward the opening and the lid held by the door is attached to the container main body, a force in which the stage driving mechanism presses the stage toward the base is smaller than a force in which the door driving mechanism presses the door toward the opening.

5. The load port of claim 1, wherein the movement restricting part includes:
    a rotary part provided to be rotatable around a rotary shaft extending along a direction intersecting a moving direction of the stage; and
    a switching part configured to switch between the restricting state and the releasing state by rotating the rotary part.

6. The load port of claim 1, wherein, when the door is pressed toward the opening and the lid held by the door is attached to the container main body, a force in which the stage driving mechanism presses the stage toward the base is smaller than a force in which the door driving mechanism presses the door toward the opening.

* * * * *